United States Patent
Fukuzumi et al.

(10) Patent No.: US 8,247,863 B2
(45) Date of Patent: Aug. 21, 2012

(54) NONVOLATILE SEMICONDUCTOR MEMORY DEVICE AND METHOD OF MANUFACTURING THE SAME

(75) Inventors: Yoshiaki Fukuzumi, Yokohama (JP);
Ryota Katsumata, Yokohama (JP);
Masaru Kito, Yokohama (JP); Masaru Kidoh, Komae (JP); Hiroyasu Tanaka, Tokyo (JP); Megumi Ishiduki, Yokohama (JP); Yosuke Komori, Yokohama (JP); Hideaki Aochi, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 337 days.

(21) Appl. No.: 12/708,161

(22) Filed: Feb. 18, 2010

(65) Prior Publication Data

US 2010/0213537 A1    Aug. 26, 2010

(30) Foreign Application Priority Data

Feb. 25, 2009   (JP) .................................. 2009-042786

(51) Int. Cl.
*H01L 29/792* (2006.01)
(52) U.S. Cl. . 257/324; 257/325; 257/326; 257/E29.309; 257/E21.645; 257/E27.103; 438/287; 438/588
(58) Field of Classification Search .......... 257/324–326, 257/E29.309, E21.645, E27.103, E21.68; 438/287, 588
See application file for complete search history.

(56) References Cited

U.S. PATENT DOCUMENTS

| | | | | |
|---|---|---|---|---|
| 6,870,215 | B2 * | 3/2005 | Endoh et al. ................. | 257/316 |
| 7,847,342 | B2 * | 12/2010 | Fukuzumi et al. ............ | 257/324 |
| 7,875,922 | B2 * | 1/2011 | Arai et al. .................... | 257/316 |
| 7,936,004 | B2 * | 5/2011 | Kito et al. .................... | 257/324 |
| 2007/0252201 | A1 * | 11/2007 | Kito et al. .................... | 257/331 |
| 2008/0315296 | A1 * | 12/2008 | Tanaka et al. ................ | 257/326 |
| 2009/0090960 | A1 * | 4/2009 | Izumi et al. ................... | 257/324 |
| 2009/0090965 | A1 | 4/2009 | Kito et al. | |

(Continued)

FOREIGN PATENT DOCUMENTS

| | | |
|---|---|---|
| JP | 2007-266143 | 10/2007 |
| JP | 2007-317874 | 12/2007 |
| WO | WO 2009/075370 A1 | 6/2009 |

OTHER PUBLICATIONS

U.S. Appl. No. 13/236,716, filed Sep. 20, 2011, Shinohara, et al.

(Continued)

*Primary Examiner* — N Drew Richards
*Assistant Examiner* — Ankush Singal
(74) *Attorney, Agent, or Firm* — Oblon, Spivak, McClelland, Maier & Neustadt, L.L.P.

(57) ABSTRACT

A memory string comprises: a pair of columnar portions; a first insulating layer surrounding a side surface of the columnar portions; a charge storage layer surrounding a side surface of the first insulating layer; a second insulating layer surrounding a side surface of the charge storage layer; and a first conductive layer surrounding a side surface of the second insulating layer. A select transistor comprises: a second semiconductor layer extending from an upper surface of the columnar portions; a third insulating layer surrounding a side surface of the second semiconductor layer; a fourth insulating layer surrounding a side surface of the third insulating layer; and a second conductive layer surrounding a side surface of the fourth insulating layer. The first semiconductor layer is formed continuously in an integrated manner with the second semiconductor layer. The first insulating layer is formed continuously in an integrated manner with the third insulating layer.

20 Claims, 22 Drawing Sheets

U.S. PATENT DOCUMENTS

| | | | |
|---|---|---|---|
| 2009/0108333 A1 | 4/2009 | Kito et al. | |
| 2009/0146206 A1* | 6/2009 | Fukuzumi et al. | 257/324 |
| 2009/0173981 A1* | 7/2009 | Nitta | 257/302 |
| 2009/0224309 A1 | 9/2009 | Kidoh et al. | |
| 2009/0230458 A1* | 9/2009 | Ishiduki et al. | 257/324 |
| 2009/0294844 A1* | 12/2009 | Tanaka et al. | 257/330 |
| 2010/0207195 A1* | 8/2010 | Fukuzumi et al. | 257/326 |

OTHER PUBLICATIONS

U.S. Appl. No. 12/679,991, filed Mar. 25, 2010, Fukuzumi et al.

Office Action issued May 30, 2011, in Korean Patent Application No. 10-2010-16563 (with English-language translation).

* cited by examiner

NONVOLATILE SEMICONDUCTOR MEMORY DEVICE AND METHOD OF MANUFACTURING THE SAME

CROSS REFERENCE TO RELATED APPLICATIONS

This application is based upon and claims the benefit of priority from prior Japanese Patent Application No. 2009-42786, filed on Feb. 25, 2009, the entire contents of which are incorporated herein by reference.

BACKGROUND OF THE INVENTION

1. Field of the Invention

The present invention relates to an electrically data-rewritable nonvolatile semiconductor memory device and a method of manufacturing the same.

2. Description of the Related Art

Conventionally, an LSI is formed by integrating elements in a two-dimensional plane on a silicon substrate. It is common practice to increase a storage capacity of memory by reducing dimensions of (miniaturizing) an element. However, in recent years, even this miniaturization is becoming difficult in terms of cost and technology. Improvements in photolithographic technology are necessary for miniaturization, but costs required for lithographic processes are steadily increasing. Moreover, even if miniaturization is achieved, it is expected that physical limitations such as those of withstand voltage between elements are encountered, unless the drive voltage and so on are scaled. In other words, there is a high possibility that operation as a device becomes difficult.

Accordingly, in recent years, there is proposed a semiconductor memory device in which memory cells are disposed three-dimensionally in order to increase a degree of integration of memory (refer to patent document 1: Japanese Unexamined Patent Application Publication No. 2007-266143).

One conventional semiconductor memory device in which memory cells are disposed three-dimensionally uses transistors with a cylindrical column-shaped structure (refer to patent document 1). The semiconductor memory device using the transistors with the cylindrical column-shaped structure is provided with multi-layer conductive layers configured to form gate electrodes, and pillar-shaped columnar semiconductors. The columnar semiconductor functions as a channel (body) portion of the transistors. A vicinity of the columnar semiconductor is provided with a memory gate insulating layer. A configuration including these conductive layer, columnar semiconductor, and memory gate insulating layer is called a memory string.

In order to provide select transistors (which utilize a non-charge-storing gate insulating film) when using the above-described technology, columnar semiconductors positioned one above the other and in contact with each other are formed in separate processes. When the columnar semiconductors are formed in separate processes and then joined, there is a risk that a contact resistance arising between the columnar semiconductors leads to an incorrect operation of the semiconductor memory device. That is, the semiconductor memory device using the above-described technology requires, for example, the likes of an interface treatment performed in a solution containing dilute hydrofluoric acid to connect upper and lower columnar semiconductors; however, there is a possibility that this causes the memory gate insulating layer to be damaged, thus making it difficult to secure a sufficiently high reliability.

SUMMARY OF THE INVENTION

In accordance with a first aspect of the present invention, a nonvolatile semiconductor memory device, comprising: a plurality of memory strings each having a plurality of electrically rewritable memory cells connected in series; and select transistors each connected to one of the ends of the memory strings, each of the memory strings comprising: a first semiconductor layer having a pair of columnar portions extending in a perpendicular direction with respect to a substrate, and a joining portion joining lower ends of the pair of columnar portions; a first insulating layer surrounding a side surface of the columnar portions; a charge storage layer surrounding a side surface of the first insulating layer; a second insulating layer surrounding a side surface of the charge storage layer; and a first conductive layer surrounding a side surface of the second insulating layer and functioning as a control electrode of the memory cells, and each of the select transistors comprising: a second semiconductor layer extending upwardly from an upper surface of the columnar portions; a third insulating layer surrounding a side surface of the second semiconductor layer; a fourth insulating layer surrounding a side surface of the third insulating layer; and a second conductive layer surrounding a side surface of the fourth insulating layer and functioning as a control electrode of the select transistors, the first semiconductor layer being formed continuously in an integrated manner with the second semiconductor layer, and the first insulating layer being formed continuously in an integrated manner with the third insulating layer.

In accordance with a second aspect of the present invention, a nonvolatile semiconductor memory device, comprising: a plurality of memory strings each having a plurality of electrically rewritable memory cells connected in series; select transistors each connected to one of the ends of the memory strings; and dummy transistors provided between the memory strings and the select transistors, each of the memory strings comprising: a first semiconductor layer having a pair of columnar portions extending in a perpendicular direction with respect to a substrate, and a joining portion joining lower ends of the pair of columnar portions; a first insulating layer surrounding a side surface of the columnar portions; a charge storage layer surrounding a side surface of the first insulating layer; a second insulating layer surrounding a side surface of the charge storage layer; and a first conductive layer surrounding a side surface of the second insulating layer and functioning as a control electrode of the memory cells, each of the select transistors comprising: a second semiconductor layer extending upwardly from an upper surface of the columnar portions; a third insulating layer surrounding a side surface of the second semiconductor layer; a fourth insulating layer surrounding a side surface of the third insulating layer; and a second conductive layer surrounding a side surface of the fourth insulating layer and functioning as a control electrode of the select transistors, and each of the dummy transistors comprising: the first semiconductor layer; an insulating layer surrounding the side surface of the columnar portions in the first semiconductor layer; and a third conductive layer formed between the first conductive layer and the second conductive layer so as to surround a side surface of the insulating layer and functioning as a control electrode of the dummy transistors.

In accordance with a third aspect of the present invention, a method of manufacturing a nonvolatile semiconductor memory device, the nonvolatile semiconductor memory device including a plurality of memory strings each having a plurality of electrically rewritable memory cells connected in series, and select transistors each connected to one of the ends of the memory strings, comprising: depositing a plurality of first conductive layers sandwiched by first interlayer insulating layers; depositing on an upper layer of the first conductive layers a second conductive layer sandwiched by second interlayer insulating layers; penetrating the plurality of first conductive layers in a U-shape as viewed from a direction parallel to a substrate to form a first hole; penetrating the second conductive layer to form a second hole; forming a first insulating layer on a side surface of the first conductive layers facing the first hole and on a side surface of the second conductive layer facing the second hole; forming a charge storage layer on a side surface of the first insulating layer facing the first hole and the second hole; selectively removing the charge storage layer facing the second hole; forming a second insulating layer continuously in an integrated manner on a side surface of the charge storage layer facing the first hole and on a side surface of the first insulating layer facing the second hole; and forming a semiconductor layer continuously in an integrated manner so as to fill the first hole and the second hole.

DETAILED DESCRIPTION OF THE EMBODIMENTS

Embodiments of a nonvolatile semiconductor memory device in accordance with the present invention are described below with reference to the drawings.

First Embodiment

Figure 1:
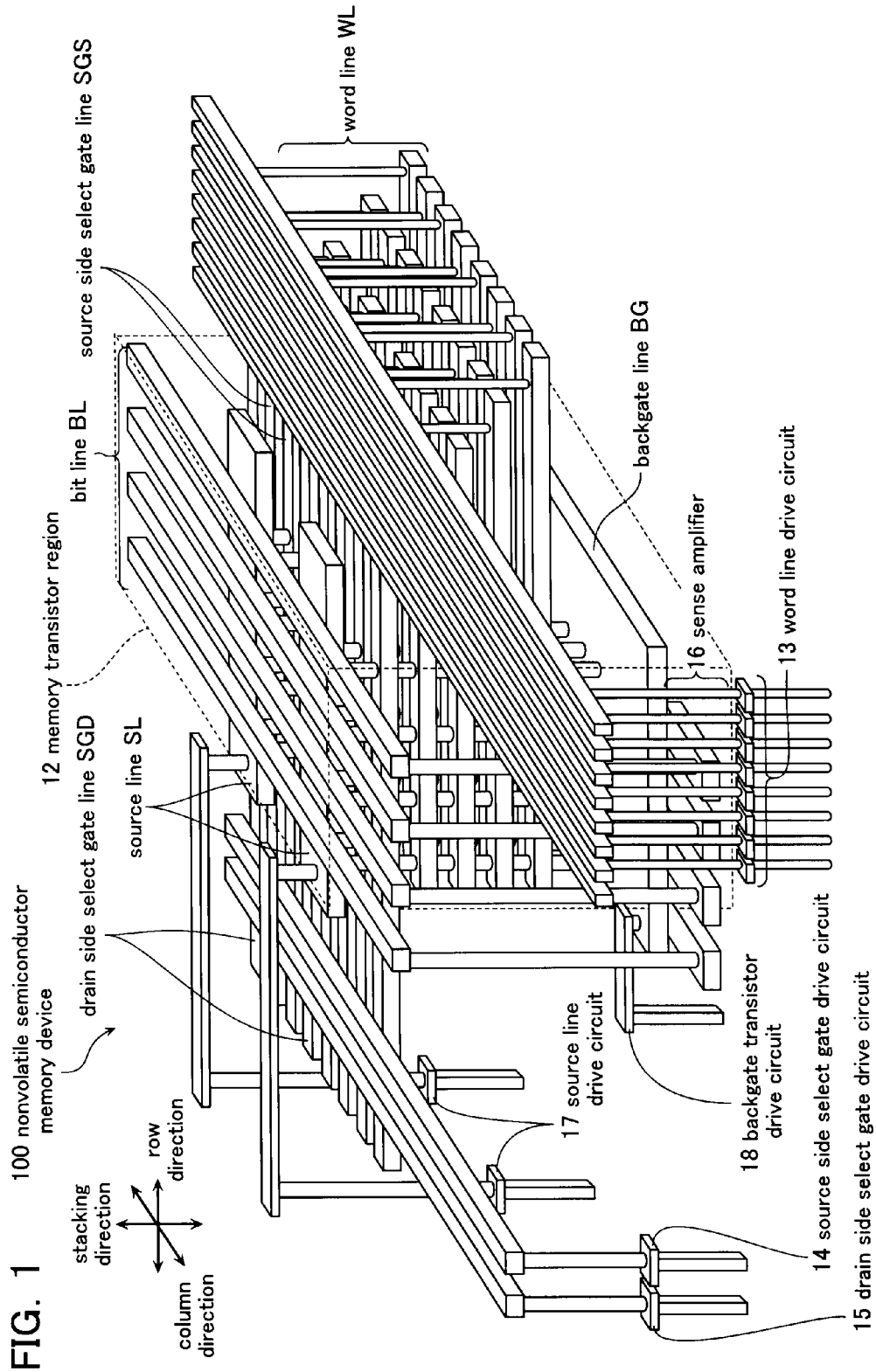
FIG. 1 is a schematic view of a configuration of a nonvolatile semiconductor memory device 100 in accordance with a first embodiment of the present invention.

Configuration of a Nonvolatile Semiconductor Memory Device 100 in Accordance with a First Embodiment FIG. 1 shows a schematic view of a nonvolatile semiconductor memory device 100 in accordance with a first embodiment of the present invention. As shown in FIG. 1, the nonvolatile semiconductor memory device 100 in accordance with the first embodiment mainly includes a memory transistor region 12, a word line drive circuit 13, a source side select gate line (SGS) drive circuit 14, a drain side select gate line (SGD) drive circuit 15, a sense amplifier 16, a source line drive circuit 17, and a back gate transistor drive circuit 18. The memory transistor region 12 includes memory transistors configured to store data. The word line drive circuit 13 controls a voltage applied to word lines WL. The source side select gate line (SGS) drive circuit 14 controls a voltage applied to a source side select gate line SGS. The drain side select gate line (SGD) drive circuit 15 controls a voltage applied to a drain side select gate line SGD. The sense amplifier 16 amplifies a potential read from the memory transistors. The source line drive circuit 17 controls a voltage applied to a source line SL. The back gate transistor drive circuit 18 controls a voltage applied to a back gate line BG. Note that, in addition to the above, the nonvolatile semiconductor memory device 100 in accordance with the first embodiment includes a bit line drive circuit (not shown) configured to control a voltage applied to a bit line BL.

Figure 2:
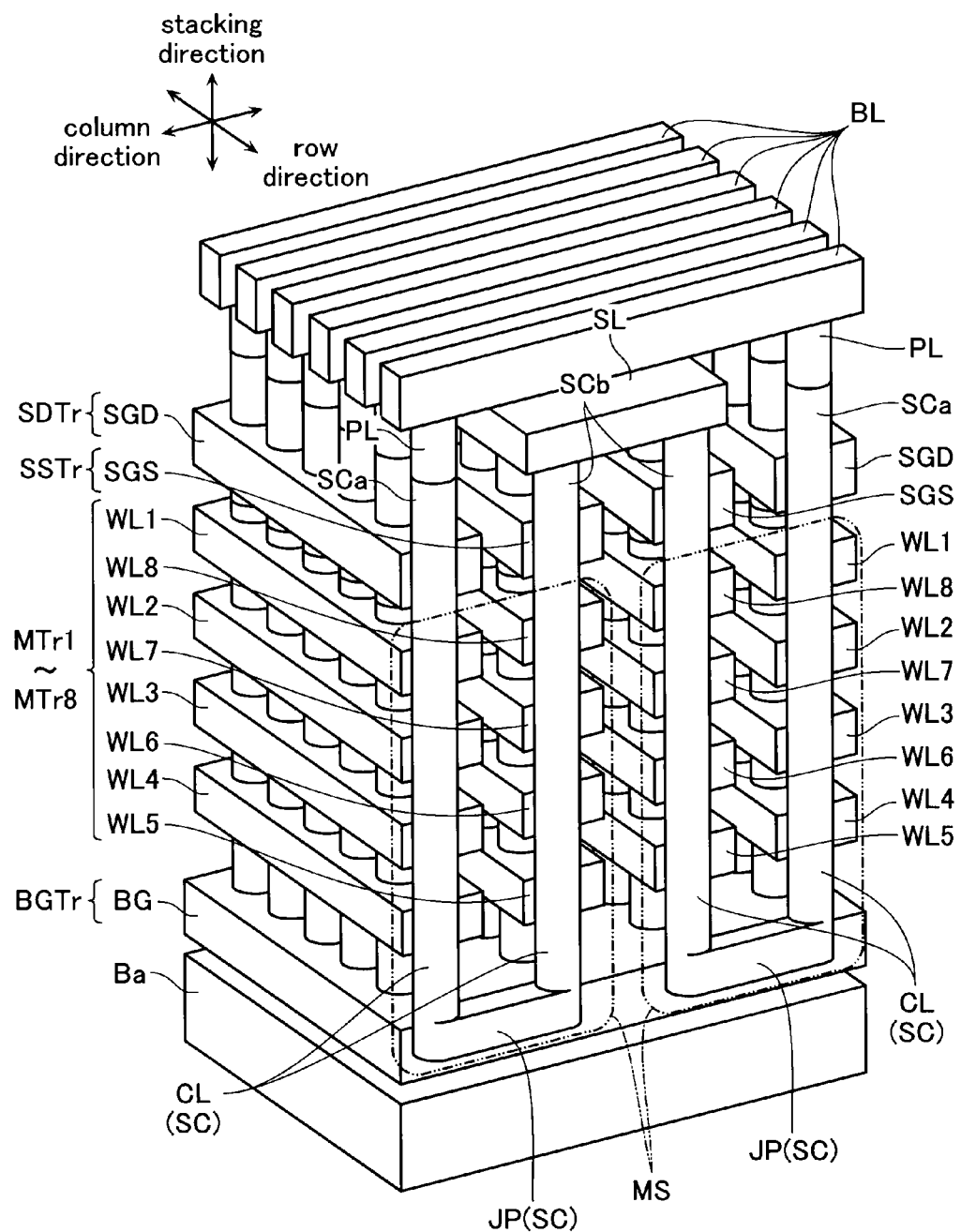
FIG. 2 is a partial schematic perspective view of a memory transistor region 12 in accordance with the first embodiment.

FIG. 2 is a schematic perspective view of part of the memory transistor region 12 of the nonvolatile semiconductor memory device 100 in accordance with the first embodiment. In the first embodiment, the memory transistor region 12 includes m×n each of memory strings MS, drain side select transistors SDTr, and source side select transistors SSTr (where m and n are natural numbers). FIG. 2 shows an example where m=6 and n=2.

In the nonvolatile semiconductor memory device 100 in accordance with the first embodiment, the memory transistor region 12 is provided with a plurality of the memory strings MS. As described in detail hereafter, each of the memory strings MS has a configuration in which a plurality of electrically rewritable memory transistors MTr are connected in series. The memory transistors MTr configuring the memory string MS are formed by stacking a plurality of semiconductor layers, as shown in FIGS. 1 and 2.

Each of the memory strings MS includes a U-shaped semiconductor SC, word lines WL1-WL8, and the back gate line BG.

The U-shaped semiconductor SC is formed in a U shape as viewed from a row direction. The U-shaped semiconductor SC includes a pair of columnar portions CL extending in a substantially perpendicular direction with respect to a semiconductor substrate Ba, and a joining portion JP formed so as to join lower ends of the pair of columnar portions CL. Note that the columnar portions CL may be of a cylindrical column shape or of a prismatic column shape. Moreover, the columnar portions CL may be of a column shape that has a tiered shape. Here, the row direction is a direction orthogonal to a stacking direction, and a column direction mentioned hereafter is a direction orthogonal to the stacking direction and the row direction.

The U-shaped semiconductors SC are disposed such that a line joining central axes of the pair of columnar portions CL is parallel to the column direction. Furthermore, the U-shaped semiconductors SC are disposed to form a matrix in a plane configured from the row direction and the column direction.

The word lines WL1-WL8 in each layer have a shape extending in parallel to the row direction. The word lines WL1-WL8 in each layer are formed in a repeating manner in lines insulated and isolated from each other and having a certain pitch in the column direction. The word line WL1 is formed in the same layer as the word line WL8. Similarly, the word line WL2 is formed in the same layer as the word line WL7, the word line WL3 is formed in the same layer as the word line WL6, and the word line WL4 is formed in the same layer as the word line WL5.

Gates of memory transistors MTr1-MTr8 provided at the same position in the column direction and forming a line in the row direction are connected to identical word lines WL1-WL8. Ends in the row direction of each of the word lines WL1-WL8 are formed in a stepped shape. Each of the word lines WL1-WL8 is formed so as to surround a plurality of the columnar portions CL lined up in the row direction.

Formed between the word lines WL1-WL8 and the columnar portion CL is a memory gate insulating layer. The memory gate insulating layer includes a tunnel insulating layer in contact with the columnar portion CL, a charge storage layer in contact with the tunnel insulating layer, and a block insulating layer in contact with the charge storage layer. The charge storage layer has a function of storing a charge. Expressing the above-described configuration in other words, the memory gate insulating layer is formed so as to surround a side surface of the columnar portion CL; and each of the word lines WL1-WL8 is formed so as to surround the memory gate insulating layer. A configuration of the above-mentioned memory gate insulating layer is described in detail hereafter.

The drain side select transistor SDTr includes a columnar semiconductor SCa and the drain side select gate line SGD.

The columnar semiconductor SCa is formed so as to extend upwardly from an upper surface of one of the columnar portions CL. The columnar semiconductor SCa is formed continuously in an integrated manner with the columnar portion CL.

The drain side select gate line SGD is provided upwardly of an uppermost word line WL1 of the word lines. The drain side select gate line SGD has a shape extending in parallel to the row direction. The drain side select gate line SGD is formed in a repeating manner in lines provided alternately with a certain pitch in the column direction, so as to sandwich the source side select gate line SGS to be described hereafter. The drain side select gate line SGD is formed so as to surround each of a plurality of the columnar semiconductors SCa lined up in the row direction. Formed between the drain side select gate line SGD and the columnar semiconductor SCa is a drain side gate insulating layer. Expressing the above-described configuration in other words, the drain side gate insulating layer is formed so as to surround the columnar semiconductor SCa; and each of the drain side select gate lines SGD is formed so as to surround the drain side gate insulating layer. A configuration of the above-mentioned drain side gate insulating layer is described in detail hereafter.

The source side select transistor SSTr includes a columnar semiconductor SCb and the source side select gate line SGS.

The columnar semiconductor SCb is formed so as to extend upwardly from an upper surface of another of the columnar portions CL. The columnar semiconductor SCb is formed continuously in an integrated manner with the columnar portion CL.

The source side select gate line SGS is provided upwardly of an uppermost word line WL8 of the word lines. The source side select gate line SGS has a shape extending in parallel to the row direction. The source side select gate line SGS is formed in a repeating manner in lines provided with a certain pitch in the column direction, sandwiching the aforementioned drain side select gate line SGD therebetween. The source side select gate line SGS is formed so as to surround each of a plurality of the columnar semiconductors SCb lined up in the row direction. Formed between the source side select gate line SGS and the columnar semiconductor SCb is a source side gate insulating layer. Expressing the above-described configuration in other words, the source side gate insulating layer is formed so as to surround the columnar semiconductor SCb; and each of the source side select gate lines SGS is formed so as to surround the source side gate insulating layer. A configuration of the above-mentioned source side gate insulating layer is described in detail hereafter.

The back gate line BG is formed extending two-dimensionally in the row direction and the column direction so as to cover a lower portion of a plurality of the joining portions JP.

Formed between the back gate line BG and each of the joining portions JP is the aforementioned memory gate insulating layer.

Formed at upper ends of a pair of the columnar semiconductors SCb surrounded by the source side select gate line SGS and adjacent in the column direction is the source line SL.

Formed at upper ends of the columnar semiconductors SCa surrounded by the drain side select gate line SGD, with plug lines PL interposed, are the bit lines BL. Each of the bit lines BL is formed so as to be positioned upwardly of the source line SL. Each of the bit lines BL is formed in a repeating manner in lines extending in the column direction and having a certain spacing in the row direction.

Figure 3:
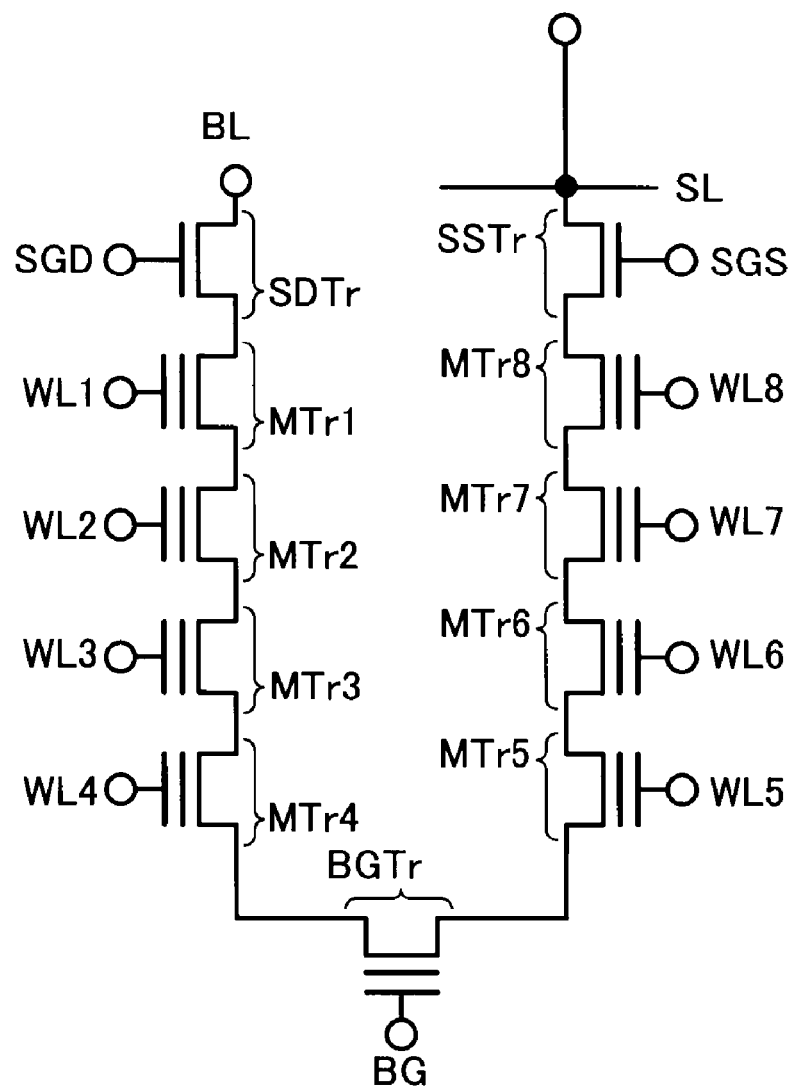
FIG. 3 is a circuit diagram of part of the nonvolatile semiconductor memory device in accordance with the first embodiment.

Next, a configuration of a circuit constituted by the memory string MS, the drain side select transistor SDTr, and the source side select transistor SSTr in the first embodiment is described with reference to FIGS. 2 and 3. FIG. 3 is a circuit diagram of one memory string MS, the drain side select transistor SDTr, and the source side select transistor SSTr in the first embodiment.

Each of the memory strings MS in the first embodiment has eight electrically rewritable memory transistors MTr1-MTr8 connected in series, as shown in FIGS. 2 and 3. The source side select transistor SSTr and the drain side select transistor SDTr are connected one to each of the two ends of the memory string MS. A back gate transistor BGTr is provided in the memory string MS (between the memory transistor MTr4 and the memory transistor MTr5).

Each of the memory transistors MTr is configured by the columnar portion CL, the memory gate insulating layer (charge storage layer), and the word line WL. An edge portion of the word line WL in contact with the memory gate insulating layer functions as a control gate electrode of the memory transistor MTr.

The drain side select transistor SDTr is configured by the columnar semiconductor SCa, the drain side gate insulating layer, and the drain side select gate line SGD. An edge portion of the drain side select gate line SGD in contact with the drain side gate insulating layer functions as a control gate electrode of the drain side select transistor SDTr.

The source side select transistor SSTr is configured by the columnar semiconductor SCb, the source side gate insulating layer, and the source side select gate line SGS. An edge portion of the source side select gate line SGS in contact with the source side gate insulating layer functions as a control gate electrode of the source side select transistor SSTr.

The back gate transistor BGTr is configured by the joining portion JP, the memory gate insulating layer (charge storage layer), and the back gate line BG. An edge portion of the back gate line BG in contact with the memory gate insulating layer functions as a control gate electrode of the back gate transistor BGTr.

(Specific Configuration of the Nonvolatile Semiconductor Memory Device 100 in Accordance with the First Embodiment)

Figure 4:
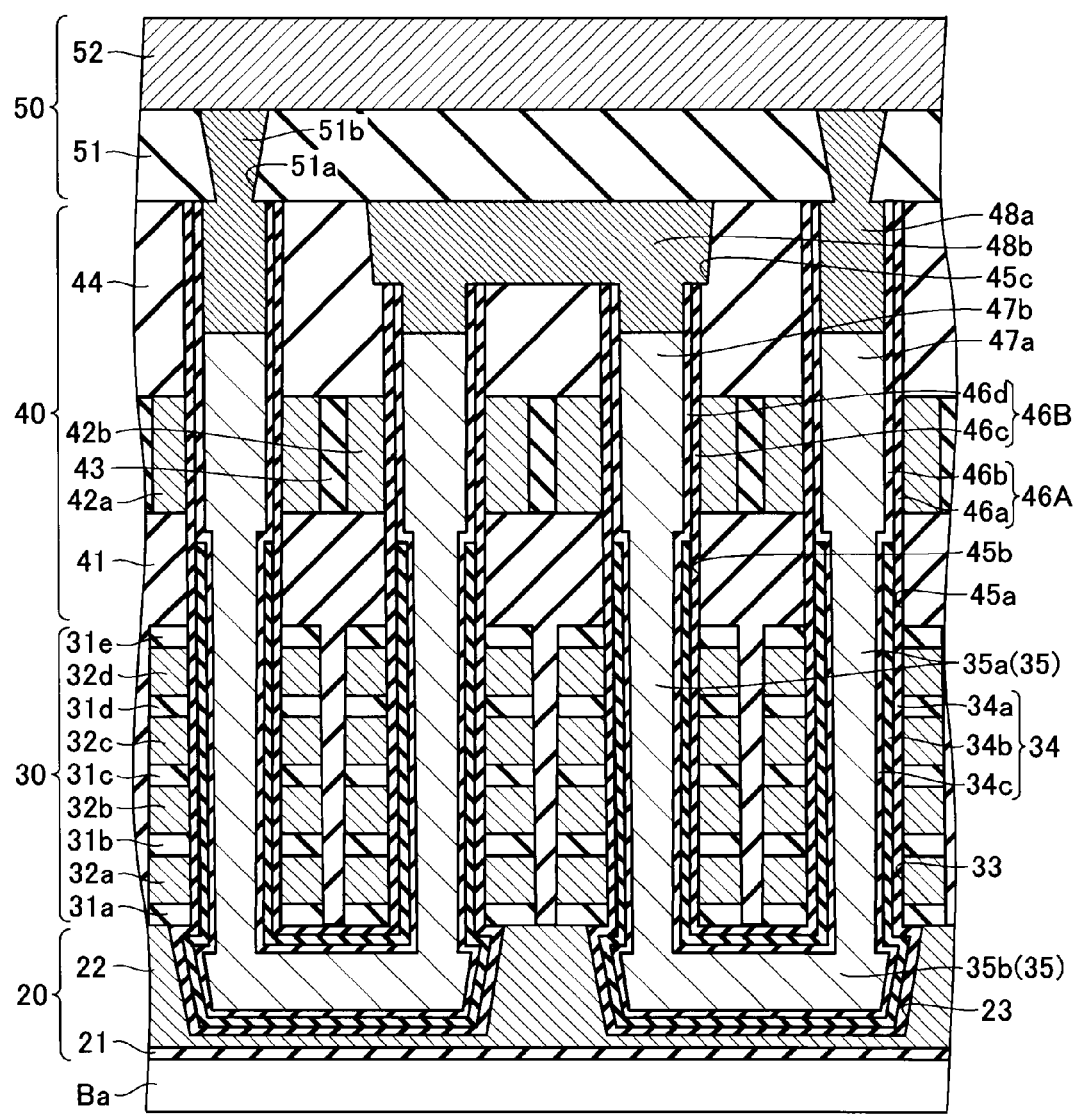
FIG. 4 is a cross-sectional view of the nonvolatile semiconductor memory device 100 in accordance with the first embodiment.

Next, a specific configuration of the nonvolatile semiconductor memory device 100 in accordance with the first embodiment is described with reference to FIG. 4. FIG. 4 is a cross-sectional view of the memory transistor region 12 of the nonvolatile semiconductor memory device 100 in accordance with the first embodiment.

The memory transistor region 12 includes, sequentially, from the semiconductor substrate Ba in the stacking direction, a back gate transistor layer 20, a memory transistor layer 30, a select transistor layer 40, and a wiring layer 50, as shown in FIG. 4. The back gate transistor layer 20 functions as the aforementioned back gate transistor BGTr. The memory transistor layer 30 functions as the aforementioned memory string MS (memory transistors MTr1-MTr8). The select transistor layer 40 functions as the aforementioned source side select transistor SSTr and drain side select transistor SDTr.

The back gate transistor layer 20 includes a back gate insulating layer 21 and a back gate conductive layer 22 that are sequentially stacked on the semiconductor substrate Ba. The back gate insulating layer 21 and the back gate conductive layer 22 are formed extending in the column direction and the row direction to extremities of the memory transistor region 12.

The back gate conductive layer 22 is formed covering a lower surface and a side surface of a joining portion 35a of a hereafter-described U-shaped semiconductor layer 35, and to the same height as an upper surface of the joining portion 35a. The back gate insulating layer 21 is constituted by silicon oxide ($SiO_2$). The back gate conductive layer 22 is constituted by polysilicon (p-Si).

In addition, the back gate transistor layer 20 includes back gate holes 23 formed so as to dig out the back gate conductive layer 22. Each of the back gate holes 23 is configured to have an opening that is short in the row direction and long in the column direction. The back gate holes 23 are formed at certain intervals in the row direction and the column direction. That is to say, the back gate holes 23 are formed in a matrix in a plane that includes the row direction and the column direction.

The memory transistor layer 30 includes first through fifth inter-word line insulating layers 31a-31e, and first through fourth word line conductive layers 32a-32d, the layers 31a-31e and 32a-32d being alternately stacked above the back gate conductive layer 22.

The first through fifth inter-word line insulating layers 31a-31e and the first through fourth word line conductive layers 32a-32d are formed in a repeating manner in lines extending in the row direction and having a certain spacing in the column direction. The first through fifth inter-word line insulating layers 31a-31e and the first through fourth word line conductive layers 32a-32d are shaped into a stepped shape at ends in the row direction. The first through fifth inter-word line insulating layers 31a-31e are constituted by silicon oxide ($SiO_2$). The first through fourth word line conductive layers 32a-32d are constituted by polysilicon (p-Si).

The memory transistor layer 30 includes memory holes 33 formed so as to penetrate the first through fifth inter-word line insulating layers 31a-31e and the first through fourth word line conductive layers 32a-32d. The memory holes 33 are formed so as to align with a position of a vicinity of both ends in the column direction of each of the back gate holes 23.

In addition, the above-described back gate transistor layer 20 and the memory transistor layer 30 include a memory gate insulating layer 34 and the U-shaped semiconductor layer 35.

The memory gate insulating layer 34 is formed on a side surface facing the memory holes 33 and the back gate holes 23. The memory gate insulating layer 34 is configured by a block insulating layer 34a, a charge storage layer 34b, and a tunnel insulating layer 34c stacked sequentially from a side surface of the memory holes 33 and the back gate holes 23. The block insulating layer 34a and the tunnel insulating layer 34c are constituted by silicon oxide ($SiO_2$). The charge storage layer is constituted by silicon nitride (SiN). The block insulating layer 34a, the charge storage layer 34b, and the tunnel insulating layer 34c each have a thickness of 1.5 nm.

The U-shaped semiconductor layer 35 is formed in a U shape as viewed from the row direction. The U-shaped semiconductor layer 35 is formed so as to be in contact with the tunnel insulating layer 34c and so as to fill the back gate hole 23 and the memory holes 33. The U-shaped semiconductor layer 35 includes a pair of columnar portions 35a extending in a perpendicular direction with respect to the semiconductor substrate Ba as viewed from the row direction, and a joining portion 35b formed so as to join lower ends of the pair of columnar portions 35a. The U-shaped semiconductor layer 35 is constituted by polysilicon (p-Si).

In the above-described configuration of the back gate transistor layer 20 and the memory transistor layer 30, the back gate conductive layer 22 functions as a control gate electrode of the back gate transistor. BGTr. The back gate conductive layer 22 functions as the back gate line BG. The first through fourth word line conductive layers 32a-32d function as control gate electrodes of the memory transistors MTr1-MTr8. The first through fourth word line conductive layers 32a-32d function as the word lines WL1-WL8.

Expressing the above-described configuration of the memory transistor layer 30 in other words, the tunnel insulating layer 34c is formed so as to surround a side surface of the columnar portion 35a. The charge storage layer 34b is formed so as to surround a side surface of the tunnel insulating layer 34c. The block insulating layer 34a is formed so as to surround a side surface of the charge storage layer 34b. The first through fourth word line conductive layers 32a-32d are formed so as to surround a side surface of the block insulating layer 34a.

The select transistor layer 40 includes an interlayer insulating layer 41 deposited on the memory transistor layer 30, a drain side conductive layer 42a, a source side conductive layer 42b, an inter-select transistor interlayer insulating layer 43, and an interlayer insulating layer 44. The interlayer insulating layer 41 is formed so as to be in contact with a side surface of the first through fifth inter-word line insulating layers 31a-31e and the first through fourth word line conductive layers 32a-32d. The drain side conductive layer 42a, the source side conductive layer 42b, and the inter-select transistor interlayer insulating layer 43 are formed in a repeating manner in lines extending in the row direction and having a certain spacing in the column direction.

The drain side conductive layer 42a is formed extending in the row direction and having a certain pitch in the column direction. Similarly, the source side conductive layer 42b is formed extending in the row direction and having a certain pitch in the column direction. A pair of the drain side conductive layers 42a and a pair of the source side conductive layers 42b are formed alternately in the column direction. The inter-select transistor interlayer insulating layer 43 is formed between the drain side conductive layer 42a and the source side conductive layer 42b formed as described above. The interlayer insulating layer 44 is formed above the drain side conductive layer 42a, the source side conductive layer 42b and the inter-select transistor interlayer insulating layer 43.

The drain side conductive layer 42a and the source side conductive layer 42b are constituted by polysilicon (p-Si). The interlayer insulating layers 41 and 44, and the inter-select transistor interlayer insulating layer 43 are constituted by silicon oxide (SiO$_2$).

In addition, the select transistor layer 40 includes drain side holes 45a, source side holes 45b, and a source line wiring trench 45c.

Each of the drain side holes 45a is formed so as to penetrate the interlayer insulating layer 44, the drain side conductive layer 42a, and the interlayer insulating layer 41. Each of the source side holes 45b is formed so as to penetrate the interlayer insulating layer 44, the source side conductive layer 42b, and the interlayer insulating layer 41. The drain side holes 45a and the source side holes 45b are formed at a position aligning with the memory holes 33. The source line wiring trench 45c is formed so as to dig out the interlayer insulating layer 44 at an upper portion of the source side holes 45b adjacent in the column direction. The source line wiring trench 45c is formed so as to connect the upper portion of the source side holes 45b adjacent in the column direction and so as to extend in the row direction.

Furthermore, the select transistor layer 40 includes drain side gate insulating layers 46A, source side gate insulating layers 46B, drain side columnar semiconductor layers 47a, source side columnar semiconductor layers 47b, plug conductive layers 48a, and a source conductive layer 48b.

The drain side gate insulating layer 46A is formed on a side surface of the drain side hole 45a. The drain side gate insulating layer 46A is configured by first and second drain side gate insulating layers 46a and 46b stacked sequentially from a side surface side of the drain side hole 45a. The first and second drain side gate insulating layers 46a and 46b are constituted by silicon oxide (SiO$_2$). The first and second drain side gate insulating layers 46a and 46b have a thickness of 1.5-6 nm. The first drain side gate insulating layer 46a is formed continuously in an integrated manner with the block insulating layer 34a. The second drain side gate insulating layer 46b is formed continuously in an integrated manner with the tunnel insulating layer 34c. Note that the first drain side gate insulating layer 46a may be formed discontinuously with the block insulating layer 34a.

The source side gate insulating layer 46B is formed on a side surface of the source side hole 45b. The source side gate insulating layer 46B is configured by first and second source side gate insulating layers 46c and 46d stacked sequentially from a side surface side of the source side hole 45b. The first and second source side gate insulating layers 46c and 46d are constituted by silicon oxide (SiO$_2$). The first and second source side gate insulating layers 46c and 46d have a thickness of 1.5-6 nm. The first source side gate insulating layer 46c is formed continuously in an integrated manner with the block insulating layer 34a. The second source side gate insulating layer 46d is formed continuously in an integrated manner with the tunnel insulating layer 34c. Note that the first source side gate insulating layer 46c may be formed discontinuously with the block insulating layer 34a.

The drain side columnar semiconductor layer 47a is formed so as to be in contact with the drain side gate insulating layer 46A to a certain height within the drain side hole 45a. The drain side columnar semiconductor layer 47a is constituted by polysilicon (p-Si). The drain side columnar semiconductor layer 47a is formed continuously in an integrated manner with the U-shaped semiconductor layer 35.

The source side columnar semiconductor layer 47b is formed so as to be in contact with the source side gate insulating layer 46B to a certain height within the source side hole 45b. The source side columnar semiconductor layer 47b is constituted by polysilicon (p-Si). The source side columnar semiconductor layer 47b is formed continuously in an integrated manner with the U-shaped semiconductor layer 35.

The plug conductive layer 48a is formed so as to fill the drain side hole 45a from the certain height within the drain side hole 45a to an upper surface of the select transistor layer 40. The source conductive layer 48b is formed so as to fill the source side holes 45b and the source line wiring trench 45c from the certain height within the source side holes 45b to the upper surface of the select transistor layer 40. The plug conductive layer 48a and the source conductive layer 48b are constituted by titanium (Ti)-titanium nitride (TiN)-tungsten (W).

In the above-described configuration of the select transistor layer 40, the drain side conductive layer 42a functions as a control gate electrode of the drain side select transistor SDTr, and also as the drain side select gate line SGD. The source side conductive layer 42b functions as a control gate electrode of the source side select transistor SSTr, and also as the source side select gate line SGS. The source conductive layer 48b functions as the source line SL.

Expressing the above-described configuration of the select transistor layer 40 in other words, the second drain side gate insulating layer 46b is formed so as to surround a side surface of the drain side columnar semiconductor layer 47a. The first drain side gate insulating layer 46a is formed so as to surround a side surface of the second drain side gate insulating layer 46b. The drain side conductive layer 42a is formed so as to surround a side surface of the first drain side gate insulating layer 46a. The second source side gate insulating layer 46d is formed so as to surround a side surface of the source side columnar semiconductor layer 47b. The first source side gate insulating layer 46c is formed so as to surround a side surface of the second source side gate insulating layer 46d. The source side conductive layer 42b is formed so as to surround a side surface of the first source side gate insulating layer 46c.

The wiring layer 50 includes an interlayer insulating layer 51, holes 51a, plug layers 51b, and a bit line layer 52. The interlayer insulating layer 51 is formed on the upper surface of the select transistor layer 40. The hole 51a is formed penetrating the interlayer insulating layer 51 at a position aligning with the drain side hole 45a. The plug layer 51b is formed to an upper surface of the interlayer insulating layer 51 so as to fill the hole 51a. The bit line layer 52 is formed in lines extending in the column direction with a certain pitch in the row direction so as to be in contact with an upper surface of the plug layer 51b. The interlayer insulating layer 51 is constituted by silicon oxide ($SiO_2$). The plug layer 51b and the bit line layer 52 are constituted by titanium (Ti)-titanium nitride (TiN)-tungsten (W).

In the above-described configuration of the wiring layer 50, the bit line layer 52 functions as the bit line BL.

(Method of Manufacturing the Nonvolatile Semiconductor Memory Device 100 in Accordance with the First Embodiment)

Next, a method of manufacturing the nonvolatile semiconductor memory device 100 in accordance with the first embodiment is described with reference to FIGS. 5-21. FIGS. 5-21 are cross-sectional views showing a manufacturing process of the nonvolatile semiconductor memory device 100 in accordance with the first embodiment.

Figure 5:
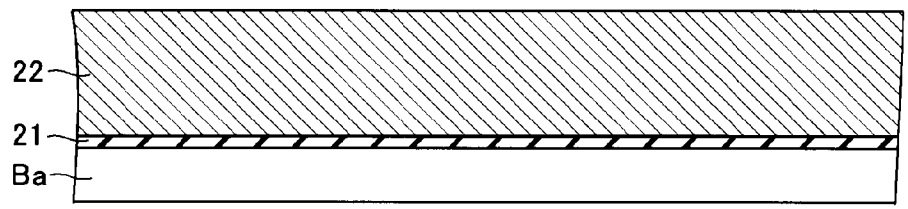
FIG. 5 is a cross-sectional view showing a manufacturing process of the nonvolatile semiconductor memory device 100 in accordance with the first embodiment.

First, silicon oxide ($SiO_2$) and polysilicon (p-Si) are deposited on the semiconductor substrate Ba to form the back gate insulating layer 21 and the back gate conductive layer 22, as shown in FIG. 5.

Figure 6:
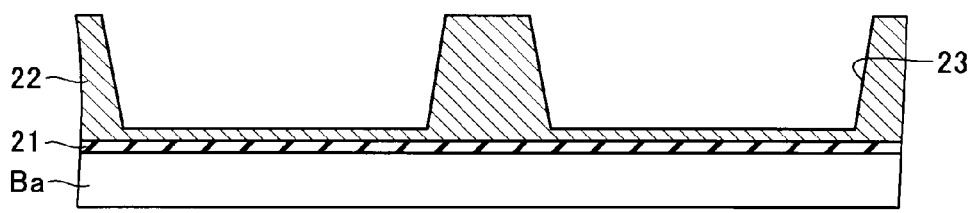
FIG. 6 is a cross-sectional view showing a manufacturing process of the nonvolatile semiconductor memory device 100 in accordance with the first embodiment.

Next, the back gate conductive layer 22 is dug out using lithography or RIE (Reactive Ion Etching) to form the back gate holes 23, as shown in FIG. 6.

Figure 7:
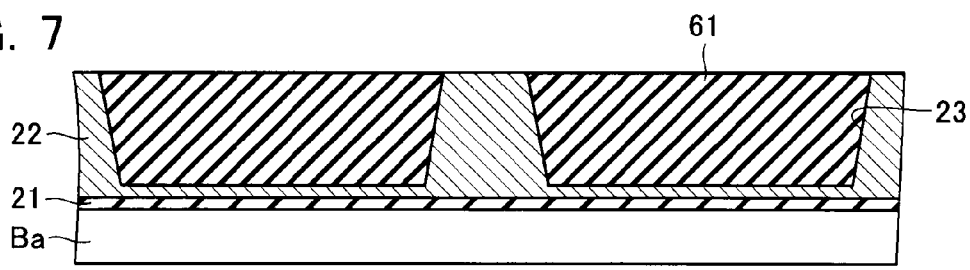
FIG. 7 is a cross-sectional view showing a manufacturing process of the nonvolatile semiconductor memory device 100 in accordance with the first embodiment.

Then, silicon nitride (SiN) is deposited so as to fill the back gate holes 23, thereby forming sacrifice layers 61, as shown in FIG. 7.

Figure 8:
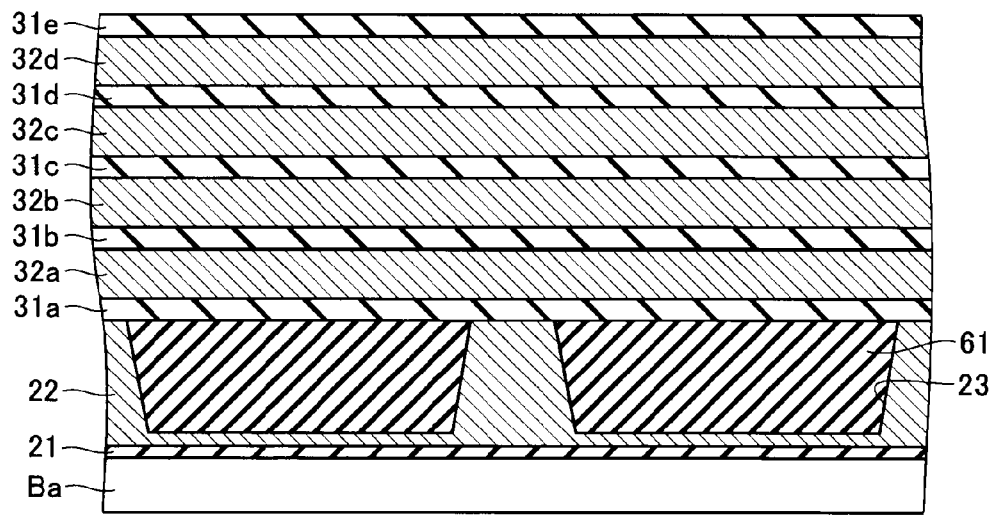
FIG. 8 is a cross-sectional view showing a manufacturing process of the nonvolatile semiconductor memory device 100 in accordance with the first embodiment.

Next, silicon oxide ($SiO_2$) and polysilicon (p-Si) are alternately deposited on the back gate conductive layer 22 and the sacrifice layers 61 to form the first through fifth inter-word line insulating layers 31a-31e and the first through fourth word line conductive layers 32a-32d, as shown in FIG. 8.

Figure 9:
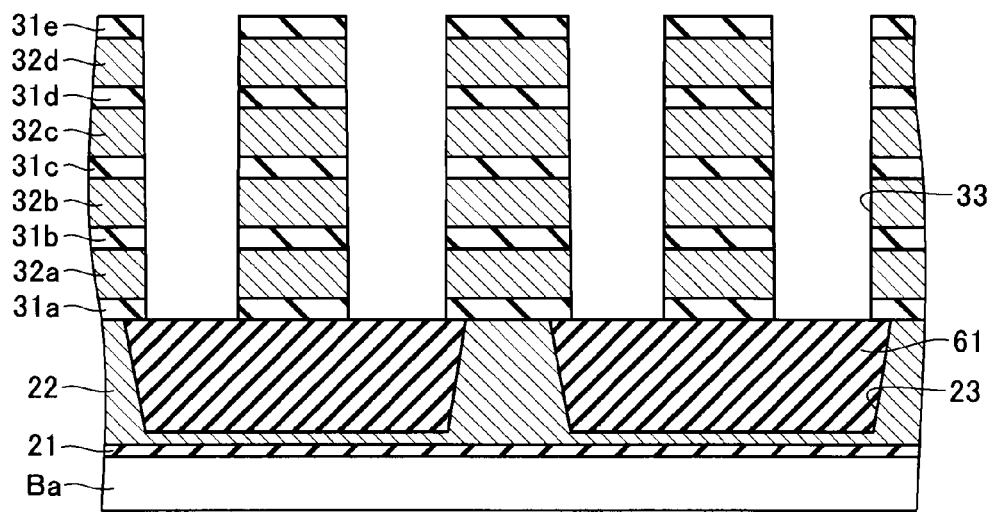
FIG. 9 is a cross-sectional view showing a manufacturing process of the nonvolatile semiconductor memory device 100 in accordance with the first embodiment.

Subsequently, the first through fifth inter-word line insulating layers 31a-31e and the first through fourth word line conductive layers 32a-32d are penetrated to form the memory holes 33, as shown in FIG. 9. The memory holes 33 are formed to reach an upper surface of both ends in the column direction of the sacrifice layers 61.

Figure 10:
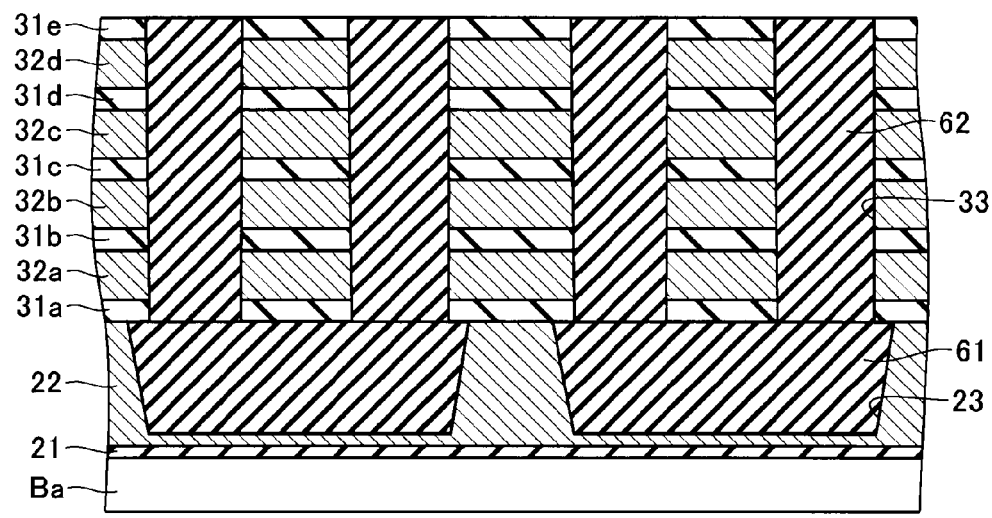
FIG. 10 is a cross-sectional view showing a manufacturing process of the nonvolatile semiconductor memory device 100 in accordance with the first embodiment.

Next, silicon nitride (SiN) is deposited so as to fill the memory holes 33, thereby forming sacrifice layers 62, as shown in FIG. 10.

Figure 11:
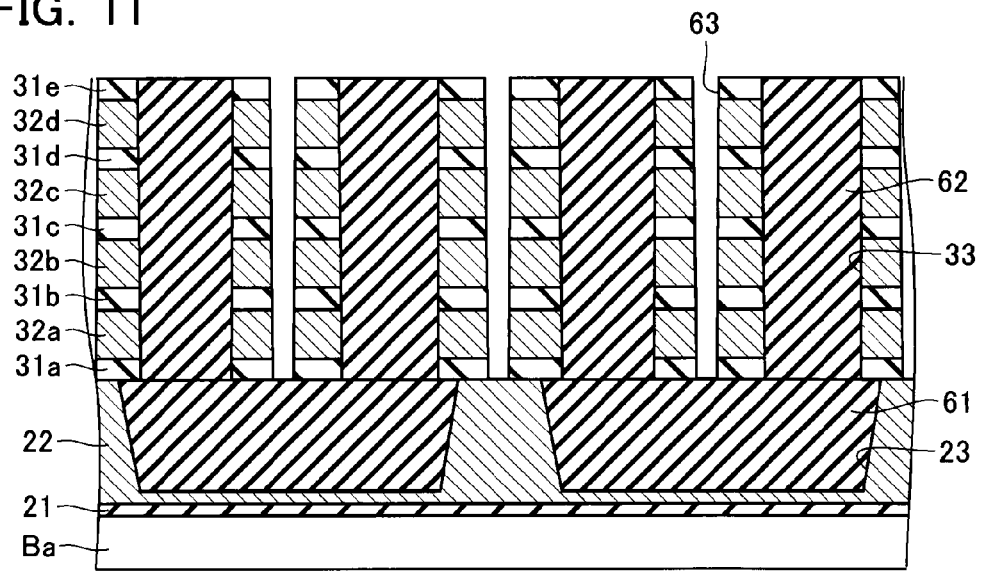
FIG. 11 is a cross-sectional view showing a manufacturing process of the nonvolatile semiconductor memory device 100 in accordance with the first embodiment.

Subsequently, the first through fifth inter-word line insulating layers 31a-31e and the first through fourth word line conductive layers 32a-32d are penetrated to form trenches 63, as shown in FIG. 11. The trenches 63 are formed between the memory holes 33 lined up in the column direction. The trenches 63 are formed so as to extend in the row direction.

Figure 12:
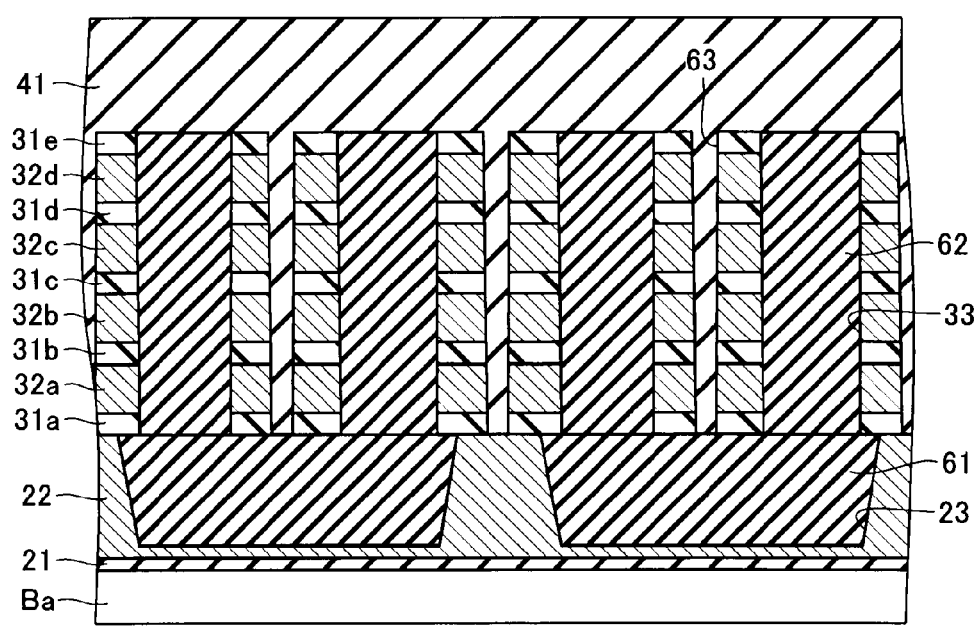
FIG. 12 is a cross-sectional view showing a manufacturing process of the nonvolatile semiconductor memory device 100 in accordance with the first embodiment.

Next, silicon oxide ($SiO_2$) is deposited so as to fill the trenches 63, thereby forming the interlayer insulating layer 41, as shown in FIG. 12.

Figure 13:
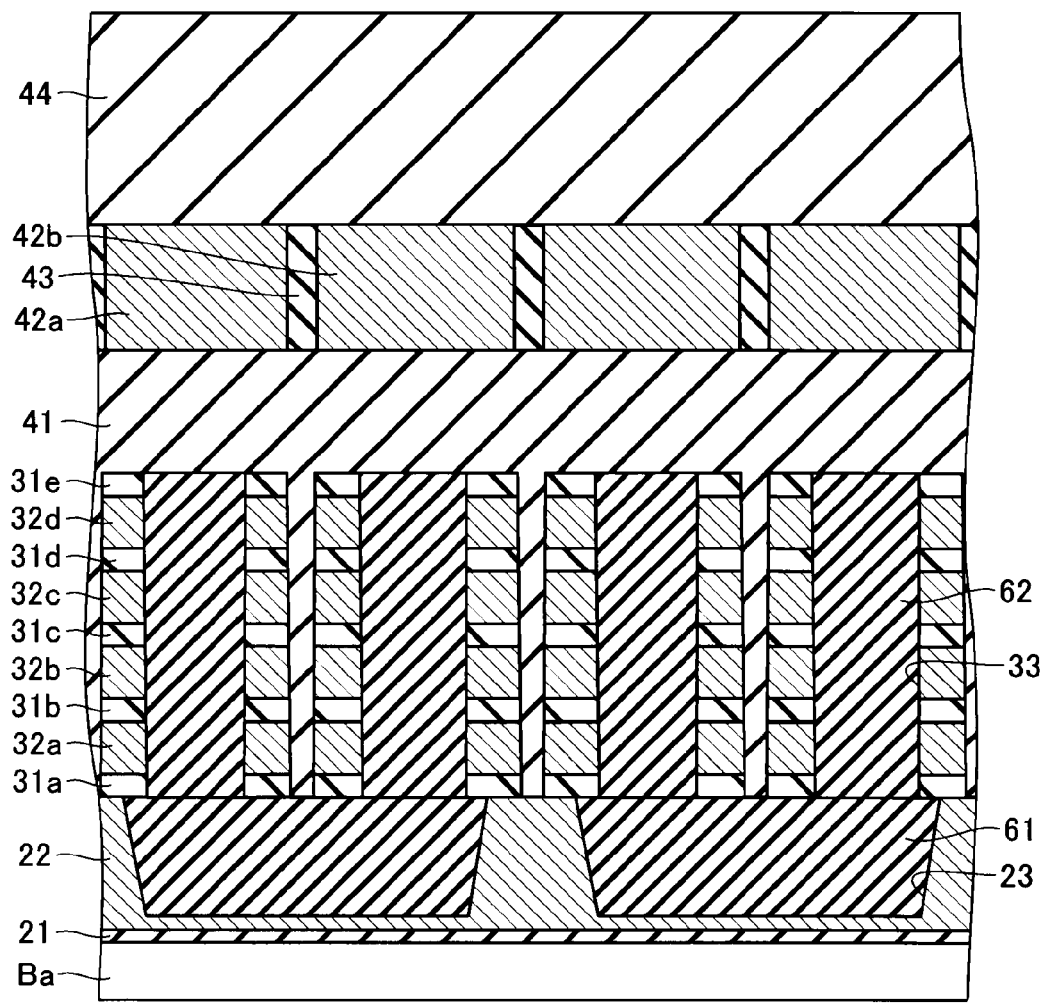
FIG. 13 is a cross-sectional view showing a manufacturing process of the nonvolatile semiconductor memory device 100 in accordance with the first embodiment.

Then, polysilicon (p-Si) is deposited on the interlayer insulating layer 41 and, subsequent to processing of this deposited polysilicon (p-Si) using lithography and RIE, silicon oxide ($SiO_2$) is deposited on the interlayer insulating layer 41, thereby forming the drain side conductive layers 42a, the source side conductive layers 42b, the inter-select transistor interlayer insulating layers 43, and the interlayer insulating layer 44, as shown in FIG. 13. Here, the drain side conductive layers 42a, the source side conductive layers 42b, and the inter-select transistor interlayer insulating layers 43 are formed so as to extend in the row direction with a certain pitch in the column direction. Pairs of the drain side conductive layers 42a and pairs of the source side conductive layers 42b are formed so as to be arranged alternately in the column direction.

Figure 14:
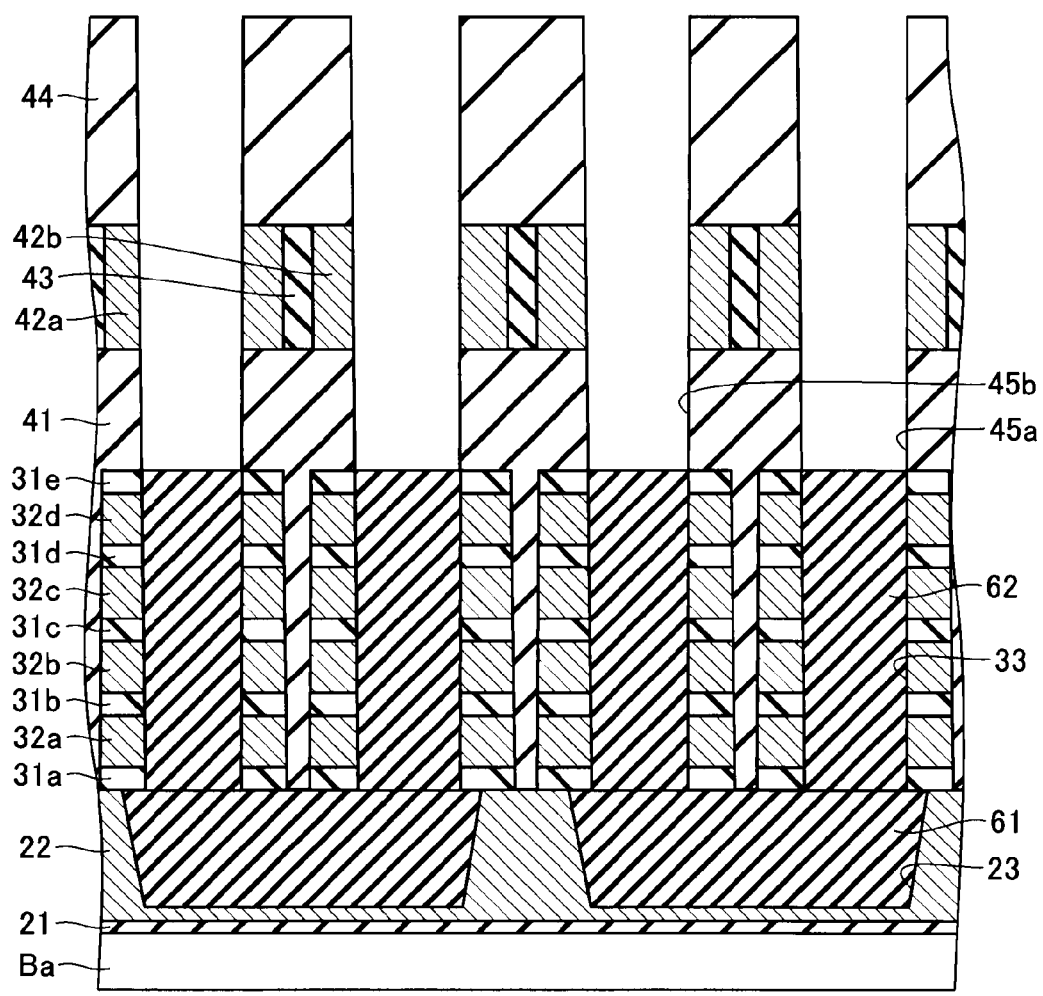
FIG. 14 is a cross-sectional view showing a manufacturing process of the nonvolatile semiconductor memory device 100 in accordance with the first embodiment.

Next, as shown in FIG. 14, the interlayer insulating layer 44, the drain side conductive layer 42a, and the interlayer insulating layer 41 are penetrated to form the drain side holes 45a; further, the interlayer insulating layer 44, the source side conductive layer 42b, and the interlayer insulating layer 41 are penetrated to form the source side holes 45b. The drain side holes 45a and the source side holes 45b are formed at a position aligning with the memory holes 33.

Figure 15:
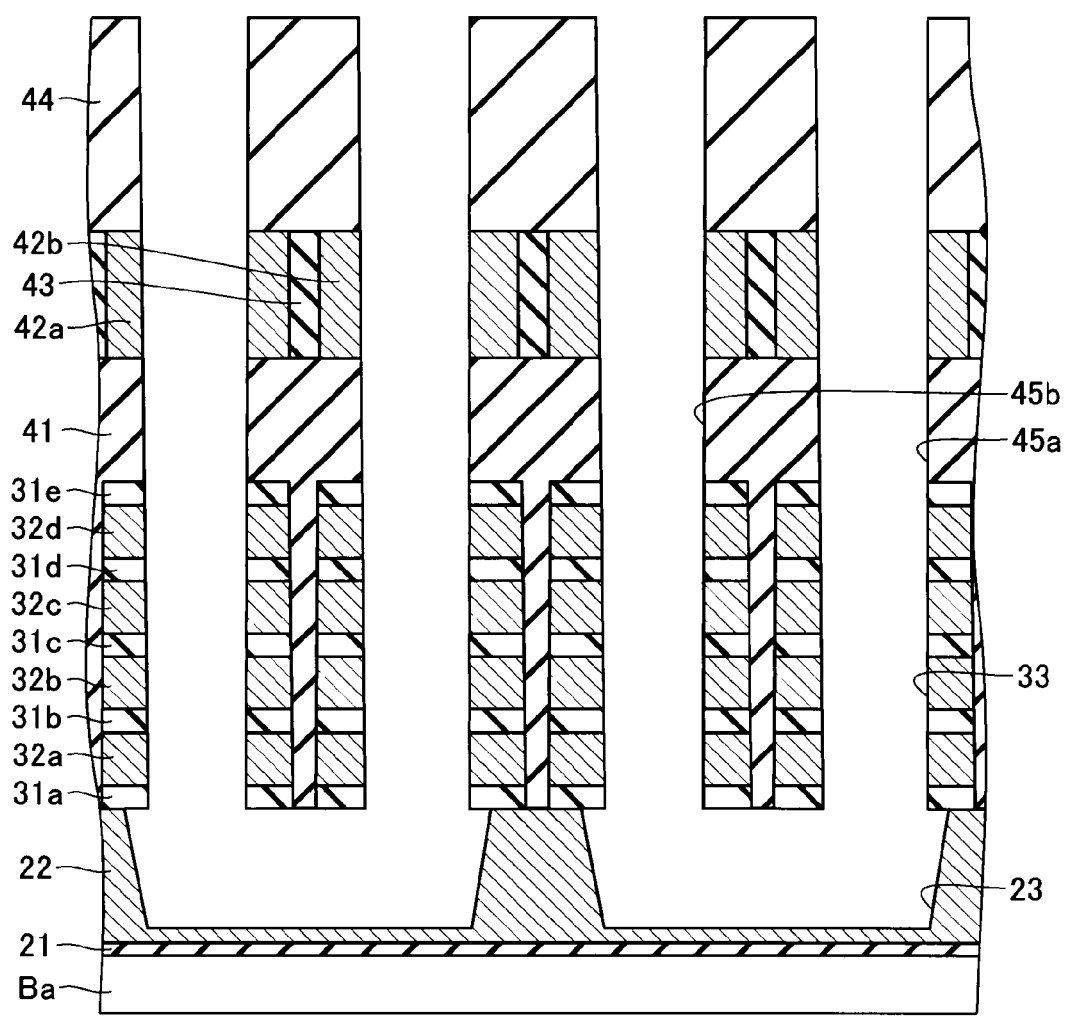
FIG. 15 is a cross-sectional view showing a manufacturing process of the nonvolatile semiconductor memory device 100 in accordance with the first embodiment.

Subsequently, the sacrifice layers 61 and 62 are removed by hot phosphoric acid solution, as shown in FIG. 15.

Figure 16:
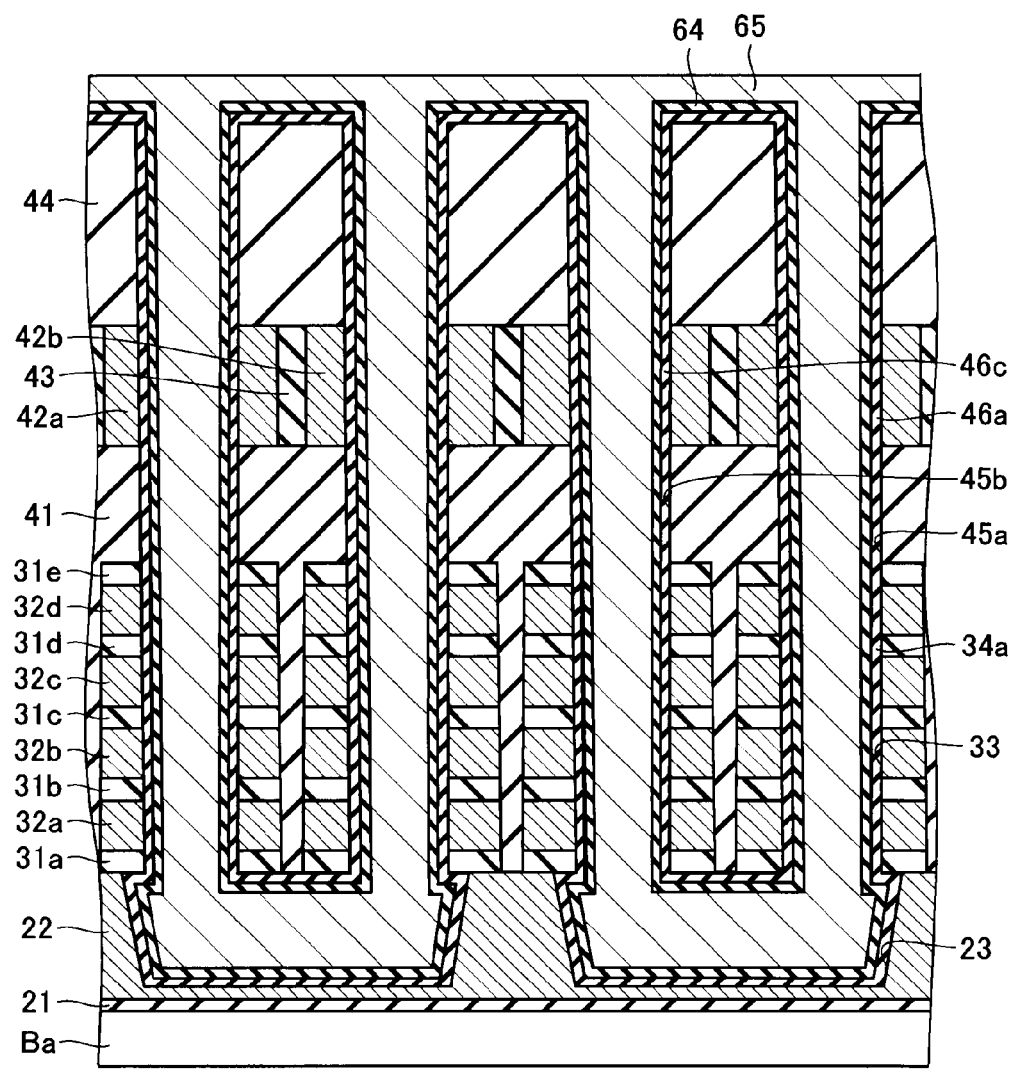
FIG. 16 is a cross-sectional view showing a manufacturing process of the nonvolatile semiconductor memory device 100 in accordance with the first embodiment.

Next, silicon oxide ($SiO_2$), silicon nitride (SiN), and polysilicon (p-Si) are deposited, as shown in FIG. 16. Through this process, the block insulating layer 34a, and the first drain side gate insulating layer 46a and first source side gate insulating layer 46c are formed continuously in an integrated manner. In addition, a silicon nitride layer 64 and a sacrifice layer 65 are formed through this process. The silicon nitride layer 64 is formed so as to cover side surfaces of the block insulating layer 34a, and the first drain side gate insulating layer 46a and first source side gate insulating layer 46c. The sacrifice layer 65 is formed so as to fill the back gate holes 23, the memory holes 33, the drain side holes 45a, and the source side holes 45b.

Figure 17:
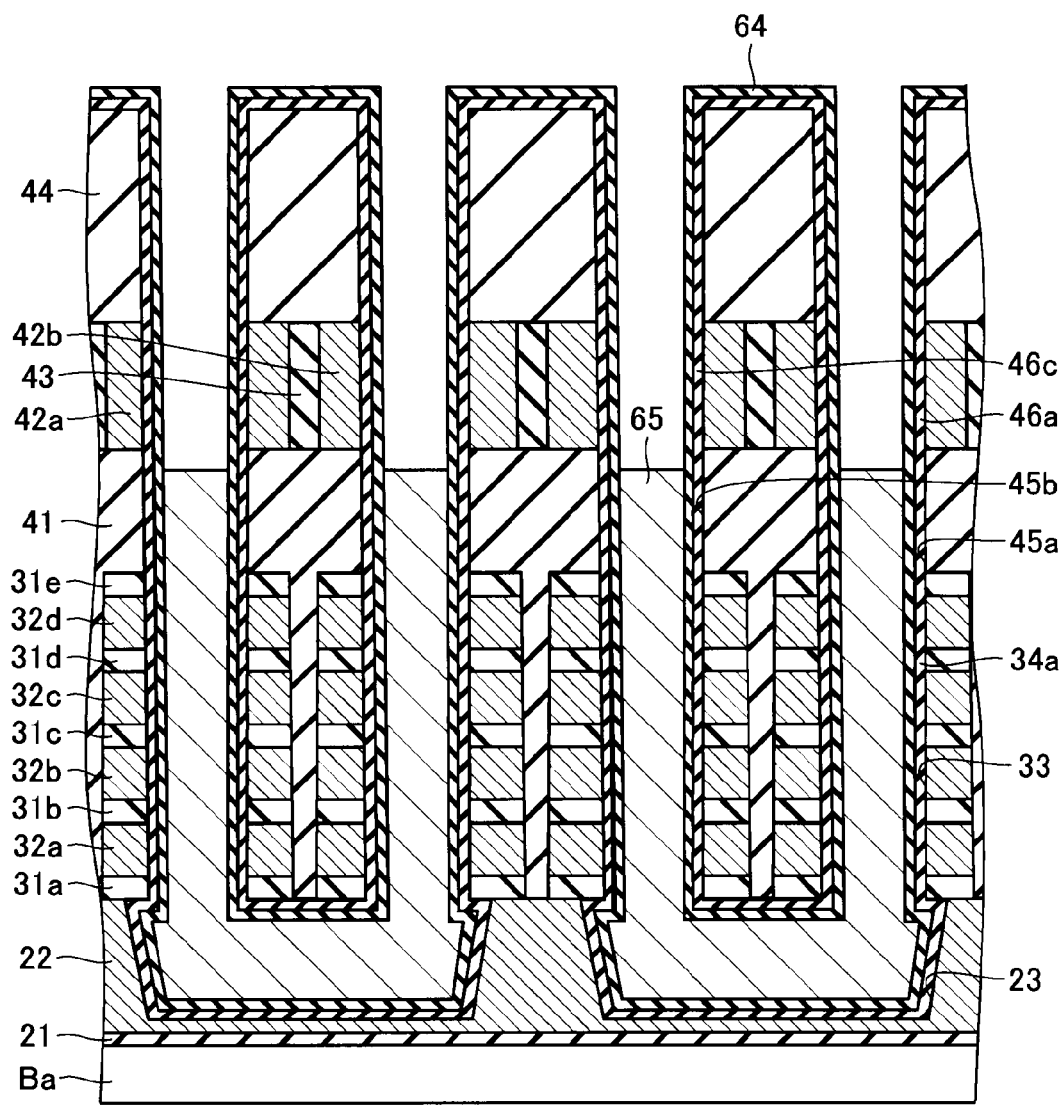
FIG. 17 is a cross-sectional view showing a manufacturing process of the nonvolatile semiconductor memory device 100 in accordance with the first embodiment.

Then, Reactive Ion Etching (RIE) is used to dig out the sacrifice layer 65 such that an upper surface of the sacrifice layer 65 lies between the drain side conductive layer 42a (source side conductive layer 42b) and the fifth inter-word line insulating layer 31e, as shown in FIG. 17.

Figure 18:
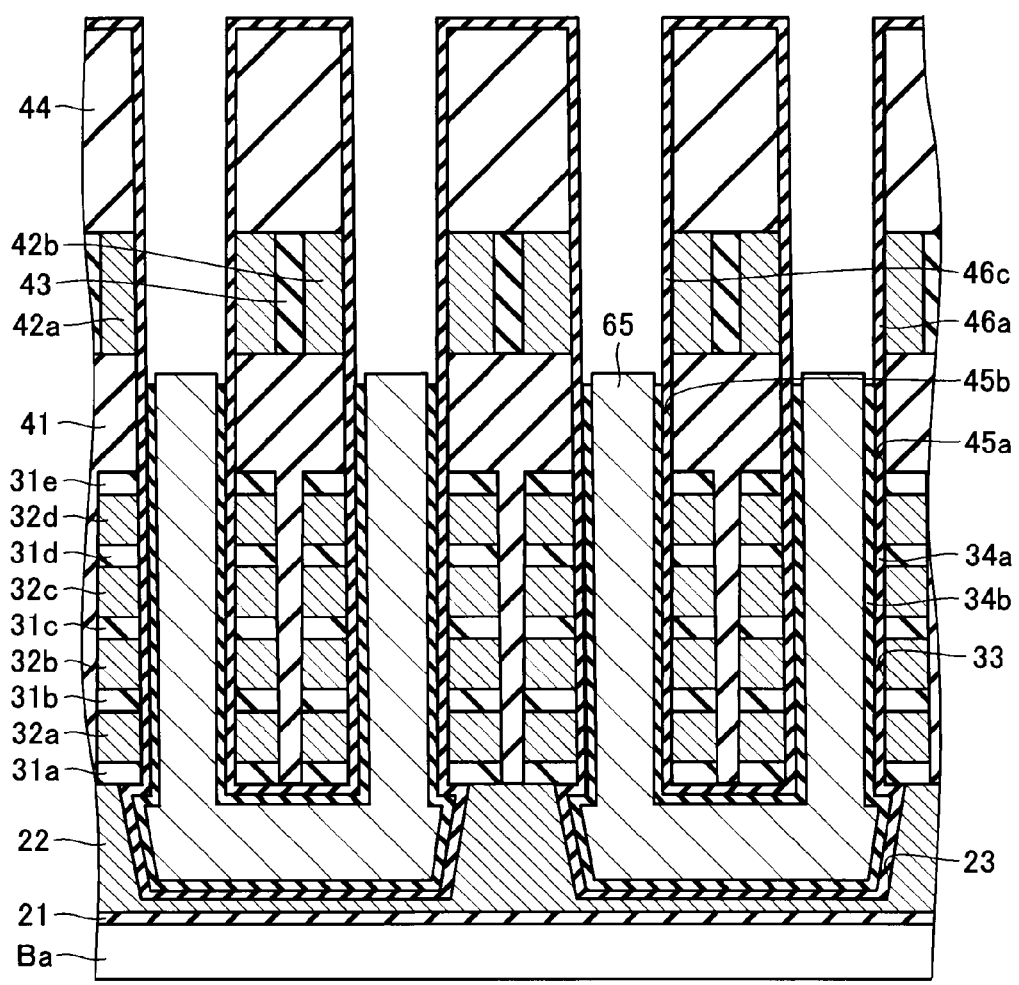
FIG. 18 is a cross-sectional view showing a manufacturing process of the nonvolatile semiconductor memory device 100 in accordance with the first embodiment.

Next, the silicon nitride layer 64 is selectively removed in hot phosphoric acid solution, using the sacrifice layer 65 as a mask, as shown in FIG. 18. That is, the silicon nitride layer 64 not covered by the sacrifice layer 65 is removed. Through this process, the silicon nitride layer 64 becomes the charge storage layer 34b.

Note that in the process shown in FIG. 18, the first drain side gate insulating layer 46a and the first source side gate insulating layer 46c may be removed along with the silicon nitride layer 64. In such a case, silicon oxide ($SiO_2$) is deposited or formed by thermal oxidation on a side surface of the drain side holes 45*a* and a side surface of the source side holes 45*b*, followed by removal of silicon oxide film at the bottom of the drain side holes 45*a* and source side holes 45*b* to reform the first drain side gate insulating layer 46*a* and the first source side gate insulating layer 46*c*.

Figure 19:
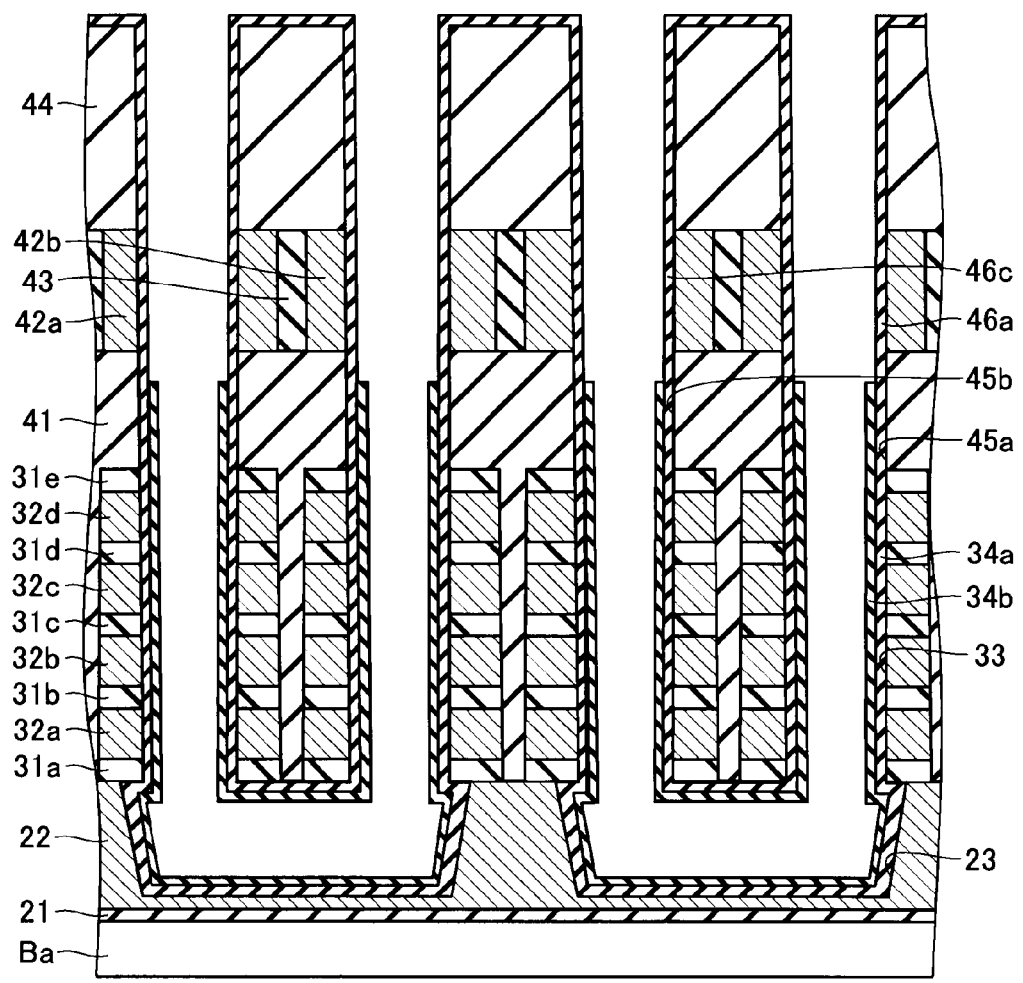
FIG. 19 is a cross-sectional view showing a manufacturing process of the nonvolatile semiconductor memory device 100 in accordance with the first embodiment.

Subsequently, the sacrifice layer 65 is removed in an organic alkaline solution, as shown in FIG. 19.

Figure 20:
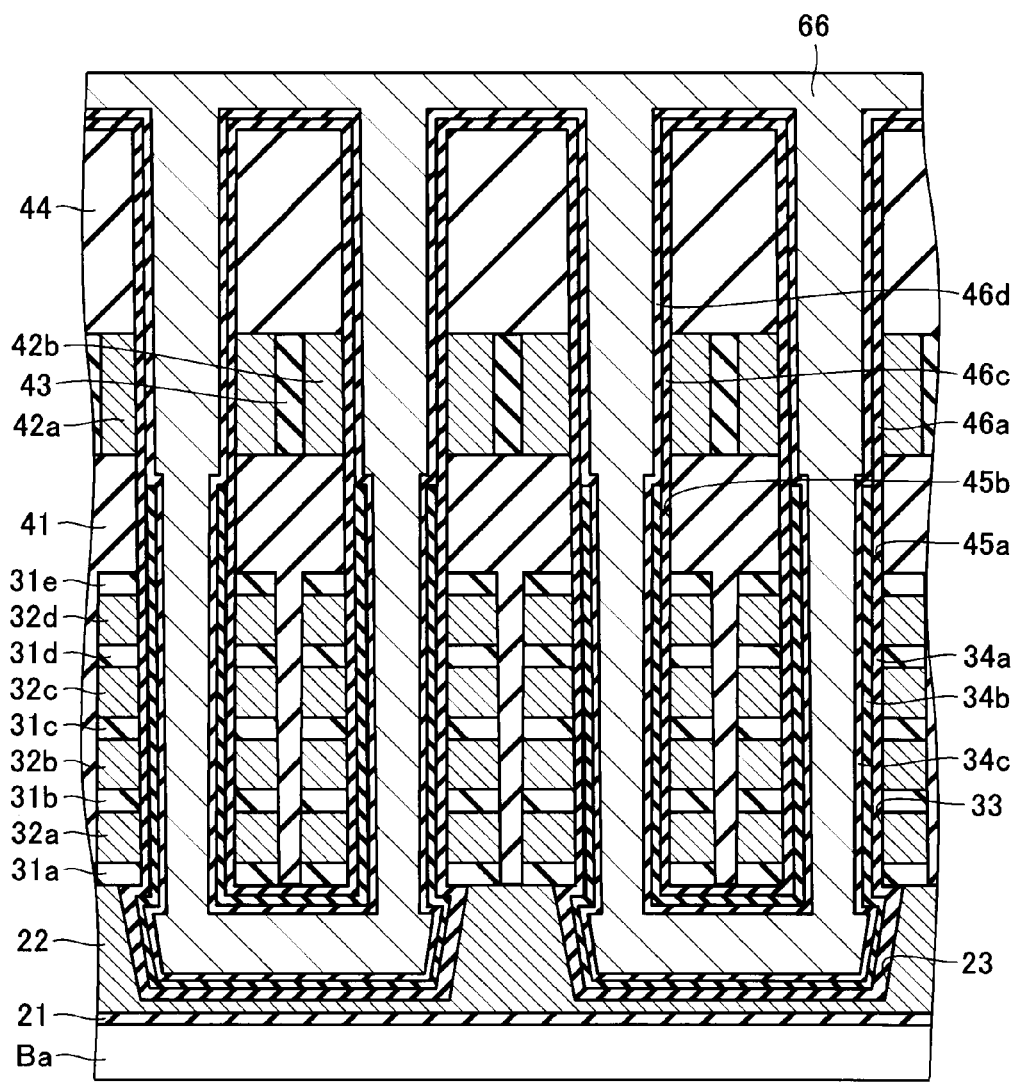
FIG. 20 is a cross-sectional view showing a manufacturing process of the nonvolatile semiconductor memory device 100 in accordance with the first embodiment.

Next, silicon oxide (SiO$_2$) and polysilicon (p-Si) are deposited so as to fill the back gate holes 23, the memory holes 33, the drain side holes 45*a*, and the source side holes 45*b*, as shown in FIG. 20. Through this process, the tunnel insulating layer 34*c*, and the second drain side gate insulating layer 46*b* and second source side gate insulating layer 46*d* are formed continuously in an integrated manner. Moreover, a polysilicon layer 66 is formed on an upper layer of the tunnel insulating layer 34*c*, and the second drain side gate insulating layer 46*b* and second source side gate insulating layer 46*d*.

Figure 21:
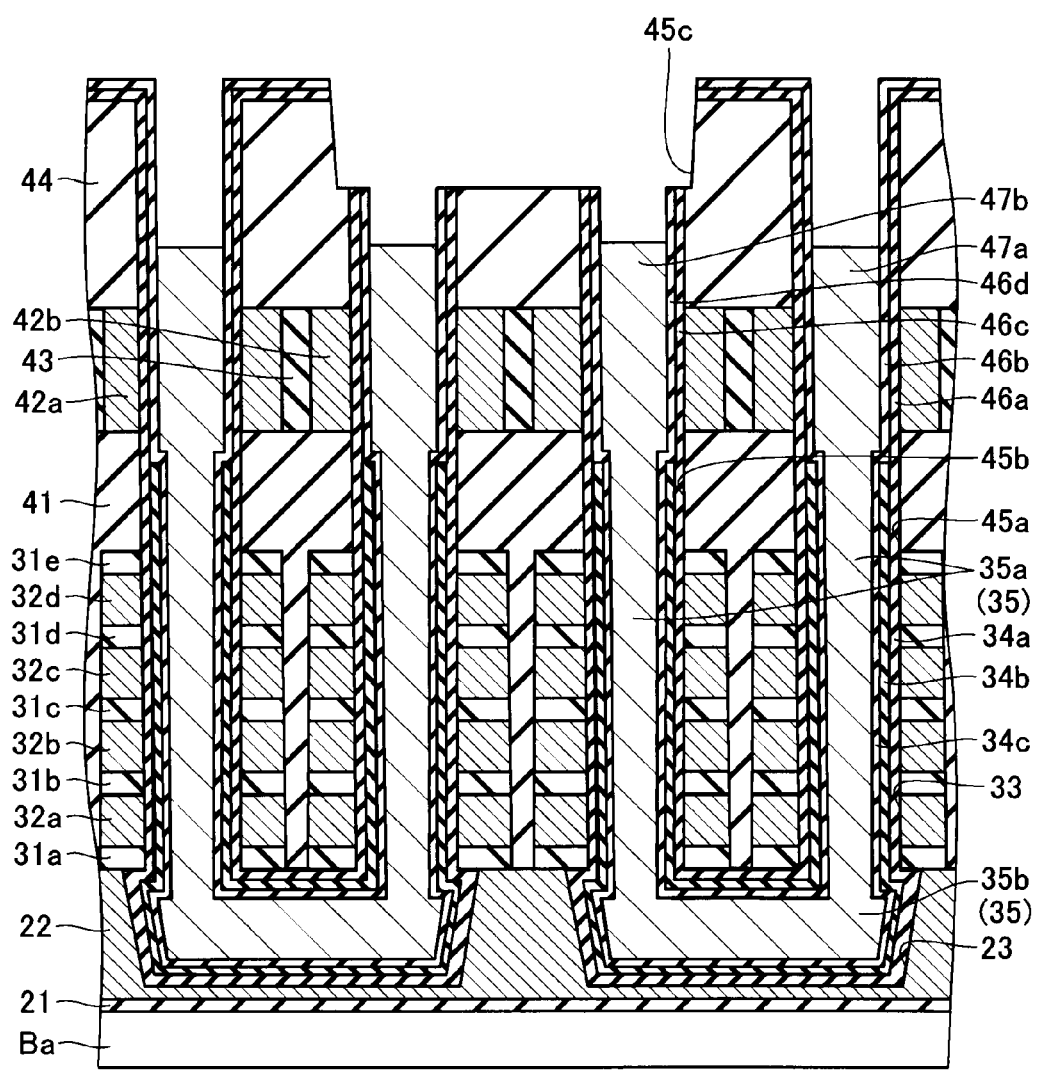
FIG. 21 is a cross-sectional view showing a manufacturing process of the nonvolatile semiconductor memory device 100 in accordance with the first embodiment.

Then, RIE is used to dig out the polysilicon layer 66 to a certain depth of the drain side holes 45*a* (source side holes 45*b*), as shown in FIG. 21. In addition, an upper portion of each of the source side holes 45*b* adjacent in the column direction is dug out so as to link up in the column direction, thereby forming the source line wiring trench 45*c*. The source line wiring trench 45*c* is formed having a rectangular shaped opening that is short in the column direction and long in the row direction. Through these processes, the polysilicon layer 66 becomes the U-shaped semiconductor layer 35, and the drain side columnar semiconductor layer 47*a* and source side columnar semiconductor layer 47*b* formed continuously in an integrated manner.

Next, titanium (Ti)-titanium nitride (TiN)-tungsten (W) are deposited so as to fill the drain side holes 45*a*, the source side holes 45*b*, and the source line wiring trench 45*c*, thereby forming the plug layers 48*a* and the source line conductive layer 48*b*. Then, the wiring layer 50 is formed, thereby completing formation of the nonvolatile semiconductor memory device 100 shown in FIG. 4.

(Advantages of the Nonvolatile Semiconductor Memory Device 100 in Accordance with the First Embodiment)

Next, advantages of the nonvolatile semiconductor memory device 100 in accordance with the first embodiment are described. The nonvolatile semiconductor memory device 100 in accordance with the first embodiment is capable of a high degree of integration as shown in the above-described stacking structure.

Furthermore, in the first embodiment, the U-shaped semiconductor layer 35 and the drain side columnar semiconductor layer 47*a* (source side columnar semiconductor layer 47*b*) are formed continuously in an integrated manner. Through such a configuration, the contact resistance between the U-shaped semiconductor layer 35 and the drain side columnar semiconductor layer 47*a* (source side columnar semiconductor layer 47*b*) can be curbed, and at the same time the charge storage layer of the drain side select transistor SDTr (source side select transistor SSTr) only can be stripped, thereby realizing a select transistor with stable threshold value characteristics.

In addition, the tunnel insulating layer 34*c* and the second drain side gate insulating layer 46*b* (second source side gate insulating layer 46*d*) are formed continuously in an integrated manner. Through such a configuration, damage induced by wet treatment processed between the tunnel insulating layer 34*c* and the second drain side gate insulating layer 46*b* (second source side gate insulating layer 46*d*) can be overcome.

Consequently, the nonvolatile semiconductor memory device 100 in accordance with the first embodiment enables stabilization of transistor characteristics and improvement in data storage characteristics and so on. That is, the nonvolatile semiconductor memory device 100 in accordance with the first embodiment enables improvement in reliability.

Moreover, in the nonvolatile semiconductor memory device 100 in accordance with the first embodiment, since each of the layers is formed continuously in an integrated manner as described above, manufacturing processes can be contracted. That is, the nonvolatile semiconductor memory device 100 in accordance with the first embodiment can be manufactured at low cost.

Second Embodiment

Figure 22:
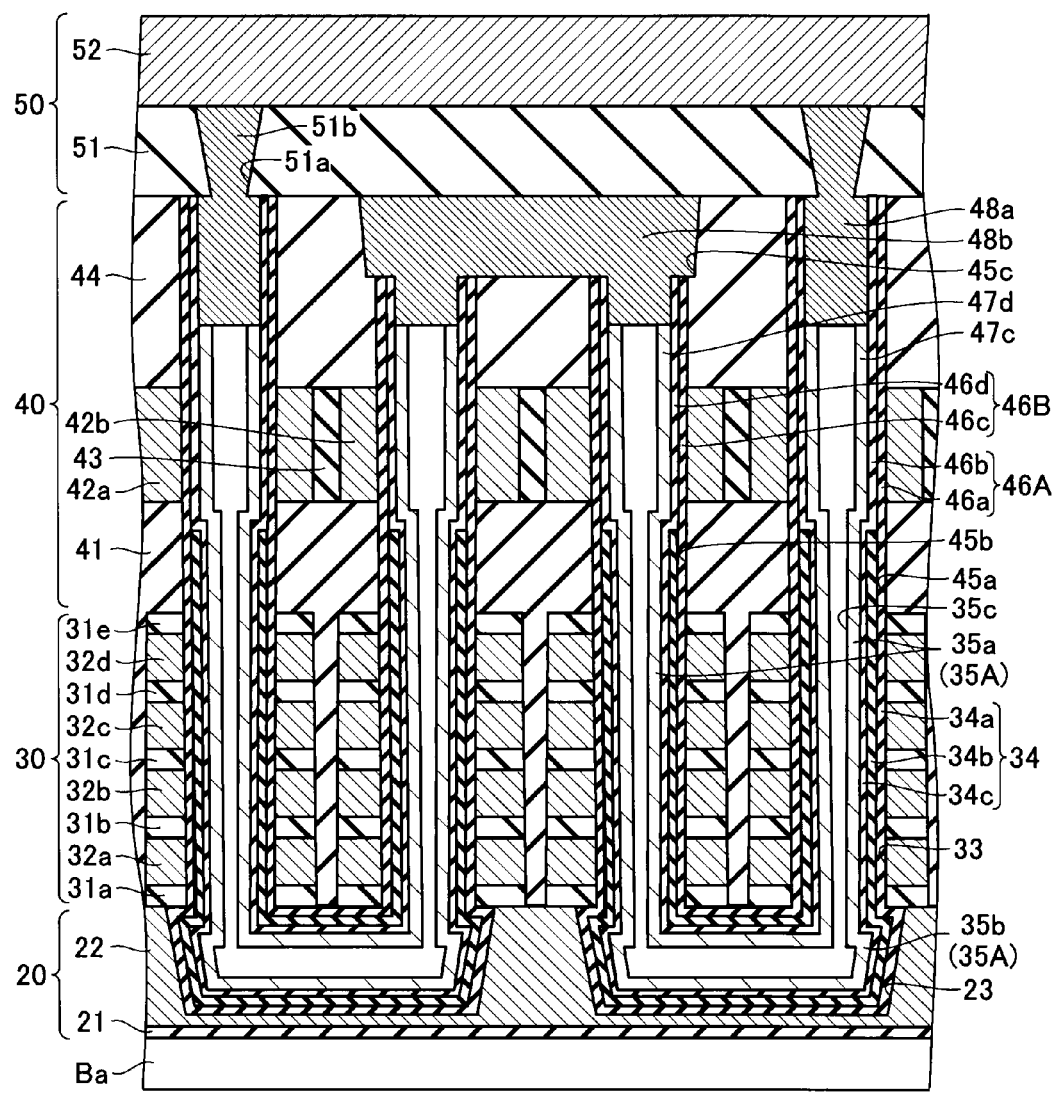
FIG. 22 is a cross-sectional view of a nonvolatile semiconductor memory device in accordance with a second embodiment of the present invention.

Specific Configuration of a Nonvolatile Semiconductor Memory Device in Accordance with a Second Embodiment Next, a specific configuration of a nonvolatile semiconductor memory device in accordance with a second embodiment is described with reference to FIG. 22. FIG. 22 is a cross-sectional view of a memory transistor region of the nonvolatile semiconductor memory device in accordance with the second embodiment. Note that in the second embodiment, identical symbols are assigned to configurations similar to those in the first embodiment and descriptions thereof are omitted.

As shown in FIG. 22, the nonvolatile semiconductor memory device in accordance with the second embodiment includes a U-shaped semiconductor layer 35A, and a drain side columnar semiconductor layer 47*c* and source side columnar semiconductor layer 47*d*, which differ from those of the first embodiment.

The U-shaped semiconductor layer 35A, and the drain side columnar semiconductor layer 47*c* and source side columnar semiconductor layer 47*d* include a hollow 35*c* on the inside thereof.

(Method of Manufacturing the Nonvolatile Semiconductor Memory Device in Accordance with the Second Embodiment)

Figure 23:
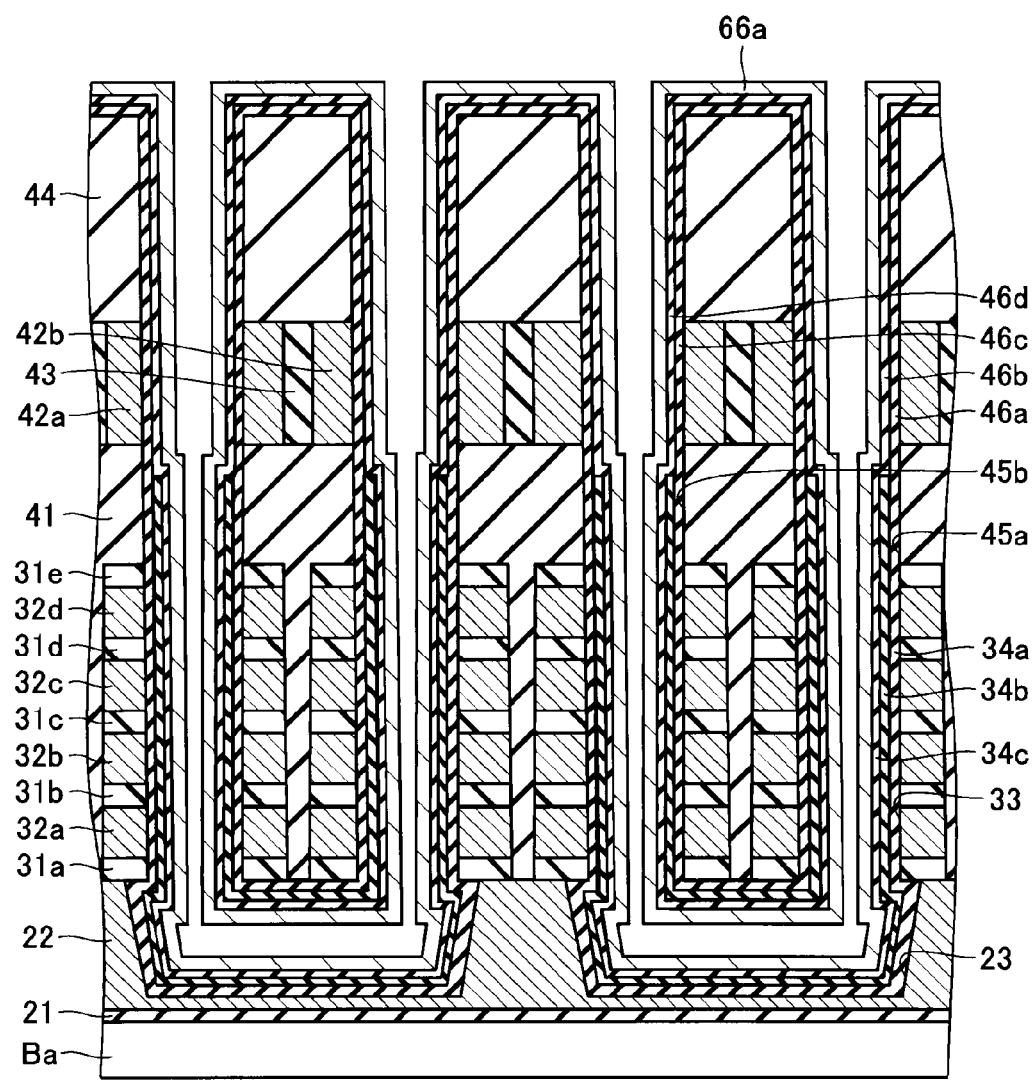
FIG. 23 is a cross-sectional view showing a manufacturing process of the nonvolatile semiconductor memory device in accordance with the second embodiment.

Next, a method of manufacturing the nonvolatile semiconductor memory device in accordance with the second embodiment is described with reference to FIG. 23. FIG. 23 is a cross-sectional view showing a manufacturing process of the nonvolatile semiconductor memory device in accordance with the second embodiment.

First, processes are executed up to and including that shown in FIG. 19 of the first embodiment. Next, silicon oxide (SiO$_2$) and polysilicon (p-Si) are deposited in the back gate holes 23, the memory holes 33, the drain side holes 45*a*, and the source side holes 45*b*, as shown in FIG. 23. Note that, at this time, polysilicon (p-Si) is deposited so as not to completely fill the back gate holes 23, the memory holes 33, the drain side holes 45*a*, and the source side holes 45*b*, thereby forming a polysilicon layer 66*a*. Then, similar manufacturing processes to those of the first embodiment are performed, thereby completing formation of the nonvolatile semiconductor memory device in accordance with the second embodiment shown in FIG. 22.

(Advantages of the Nonvolatile Semiconductor Memory Device in Accordance with the Second Embodiment)

Next, advantages of the nonvolatile semiconductor memory device in accordance with the second embodiment are described. The nonvolatile semiconductor memory device in accordance with the second embodiment has a configuration substantially similar to that of the first embodiment. Consequently, the nonvolatile semiconductor memory device in accordance with the second embodiment displays similar advantages to those of the first embodiment.

In addition, in the nonvolatile semiconductor memory device in accordance with the second embodiment, the U-shaped semiconductor layer 35A, and the drain side columnar semiconductor layer 47c and source side columnar semiconductor layer 47d are formed to include the hollow 35c. This configuration enables an electric field intensity at a channel surface of the U-shaped semiconductor layer 35A, and the drain side columnar semiconductor layer 47c and source side columnar semiconductor layer 47d to be strengthened more than in the first embodiment. Consequently, in the nonvolatile semiconductor memory device in accordance with the second embodiment, a greater number of carriers can be induced, cell current can be improved and operation can be stabilized compared to in the first embodiment, when using the same on voltage.

Moreover, the hollow 35c makes it possible to form the U-shaped semiconductor layer 35A with a uniform thickness, irrespective of a diameter of the back gate hole 23 and a diameter of the memory holes 33. The hollow 35c also makes it possible to form the drain side columnar semiconductor layer 47c and the source side columnar semiconductor layer 47d with a uniform thickness, irrespective of a diameter of the drain side hole 45a and a diameter of the source side hole 45b. In other words, in the nonvolatile semiconductor memory device in accordance with the second embodiment, characteristics of the memory transistors MTr1-MTr8, the drain side select transistor SDTr, and the source side select transistor SSTr can be maintained, unaffected by variations in opening diameter during manufacture.

Third Embodiment

Figure 24:
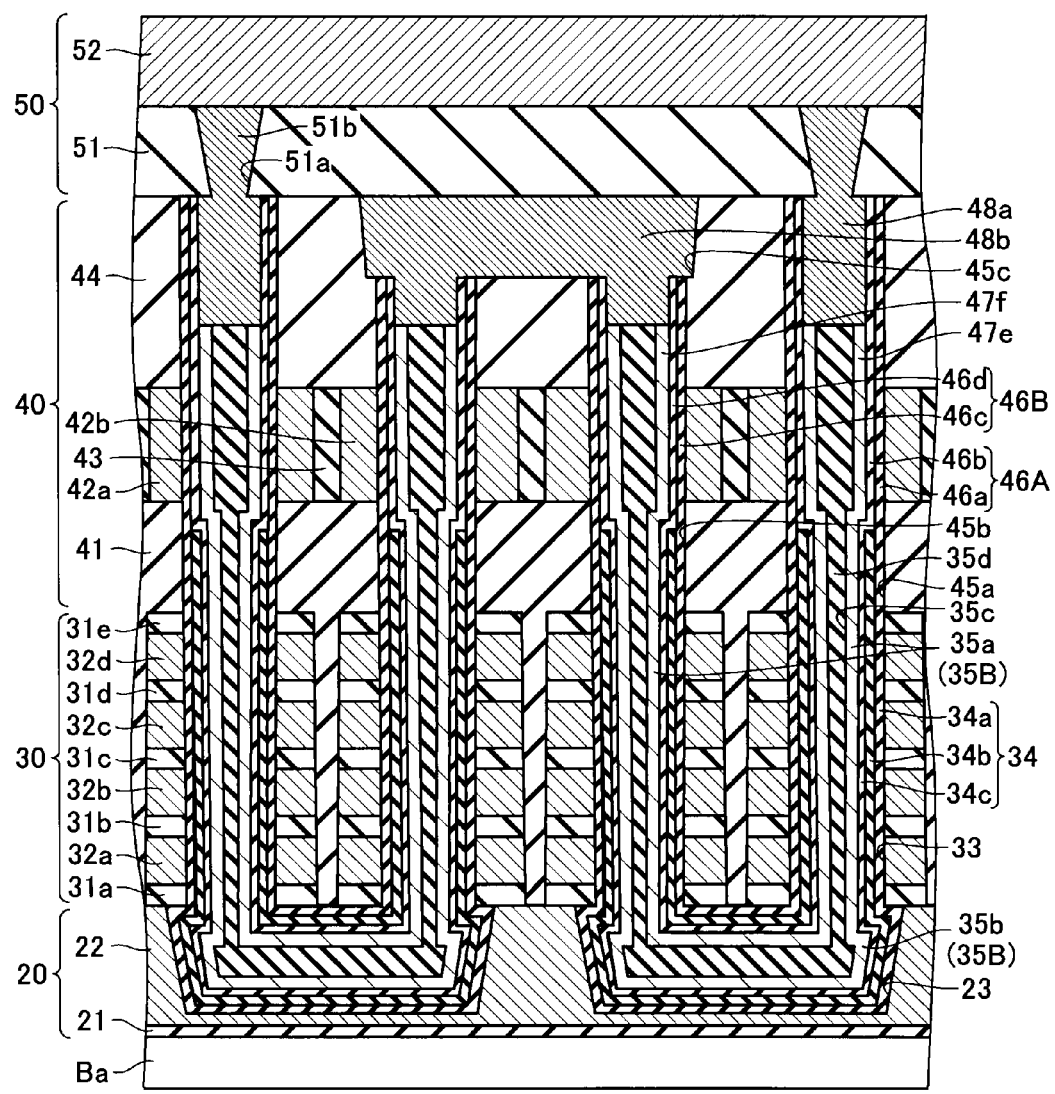
FIG. 24 is a cross-sectional view of a nonvolatile semiconductor memory device in accordance with a third embodiment of the present invention.

Specific Configuration of a Nonvolatile Semiconductor Memory Device in Accordance with a Third Embodiment Next, a specific configuration of a nonvolatile semiconductor memory device in accordance with a third embodiment is described with reference to FIG. 24. FIG. 24 is a cross-sectional view of a memory transistor region of the nonvolatile semiconductor memory device in accordance with the third embodiment. Note that in the third embodiment, identical symbols are assigned to configurations similar to those in the first and second embodiments and descriptions thereof are omitted.

As shown in FIG. 24, the nonvolatile semiconductor memory device in accordance with the third embodiment includes a U-shaped semiconductor layer 35B, and a drain side columnar semiconductor layer 47e and source side columnar semiconductor layer 47f, which differ from those of the first and second embodiments.

The U-shaped semiconductor layer 35B, and the drain side columnar semiconductor layer 47e and source side columnar semiconductor layer 47f include an internal insulating layer 35d to fill the hollow 35c. The internal insulating layer 35d is constituted by silicon oxide ($SiO_2$).

The nonvolatile semiconductor memory device in accordance with the third embodiment is formed by further depositing silicon oxide ($SiO_2$) on an upper layer of the polysilicon layer 66a, subsequent to the process shown in FIG. 23 in accordance with the second embodiment.

(Advantages of the Nonvolatile Semiconductor Memory Device in Accordance with the Third Embodiment)

Next, advantages of the nonvolatile semiconductor memory device in accordance with the third embodiment are described. The nonvolatile semiconductor memory device in accordance with the third embodiment displays similar advantages to those of the second embodiment.

Fourth Embodiment

Figure 25:
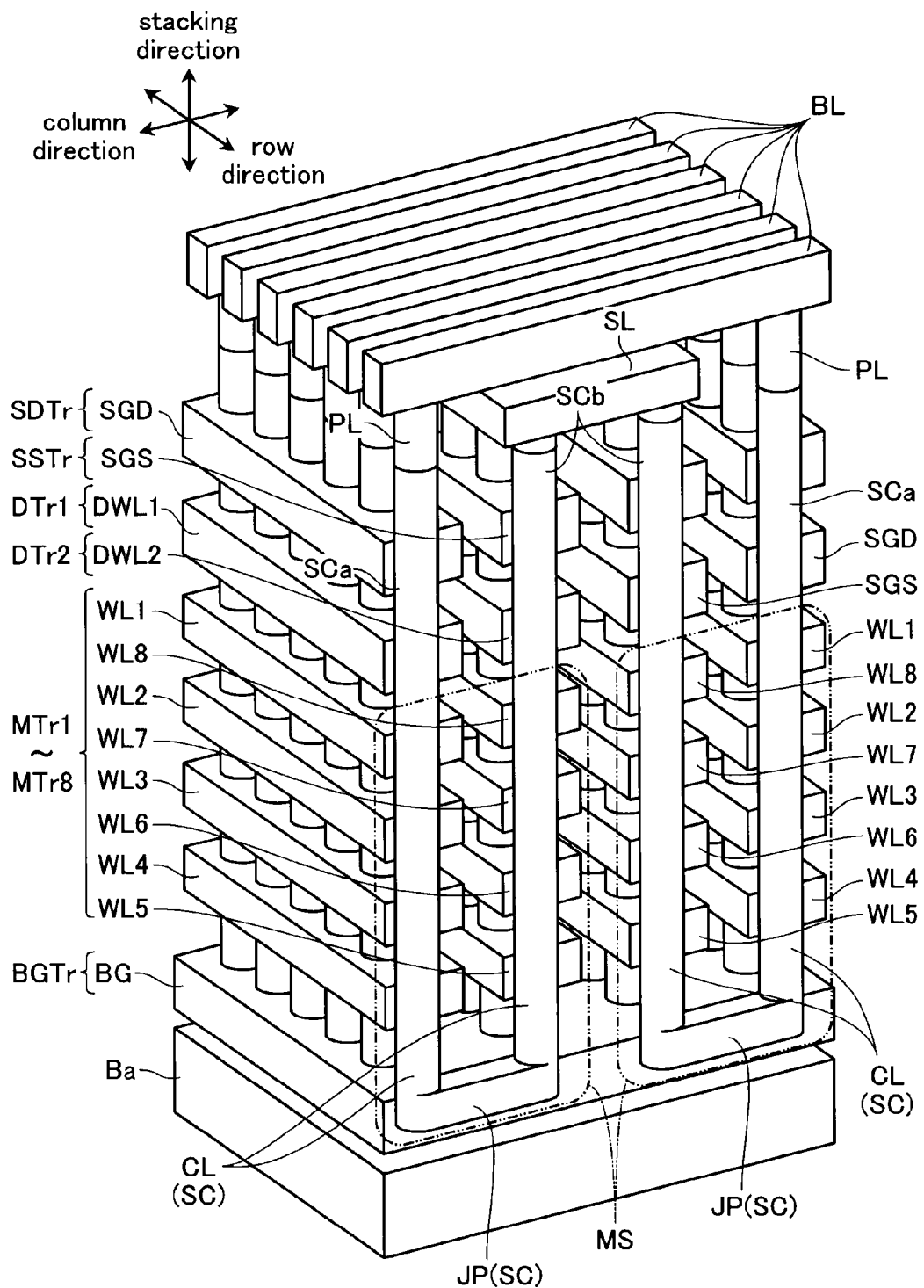
FIG. 25 is a partial schematic perspective view of a memory transistor region in accordance with a fourth embodiment of the present invention.

Configuration of a Nonvolatile Semiconductor Memory Device in Accordance with a Fourth Embodiment Next, a specific configuration of a nonvolatile semiconductor memory device in accordance with a fourth embodiment is described with reference to FIG. 25. FIG. 25 is a schematic perspective view of part of a memory transistor region of the nonvolatile semiconductor memory device in accordance with the fourth embodiment. Note that in the fourth embodiment, identical symbols are assigned to configurations similar to those in the first through third embodiments and descriptions thereof are omitted.

As shown in FIG. 25, the nonvolatile semiconductor memory device in accordance with the fourth embodiment includes dummy transistors DTr1 and DTr2 in addition to the configurations of the first through third embodiments.

The dummy transistors DTr1 and DTr2 include a U-shaped semiconductor SC (columnar portion CL) and dummy word lines DWL1 and DWL2.

The dummy word line DWL1 is formed between the word line WL1 and the drain side select gate line SGD. The dummy word line DWL2 is formed between the word line WL8 and the source side select gate line SGS. The dummy word lines DWL1 and DWL2 are formed so as to surround the columnar portion CL. Formed between the dummy word lines DWL1 and DWL2 and the columnar portion CL is a memory gate insulating layer.

Figure 26:
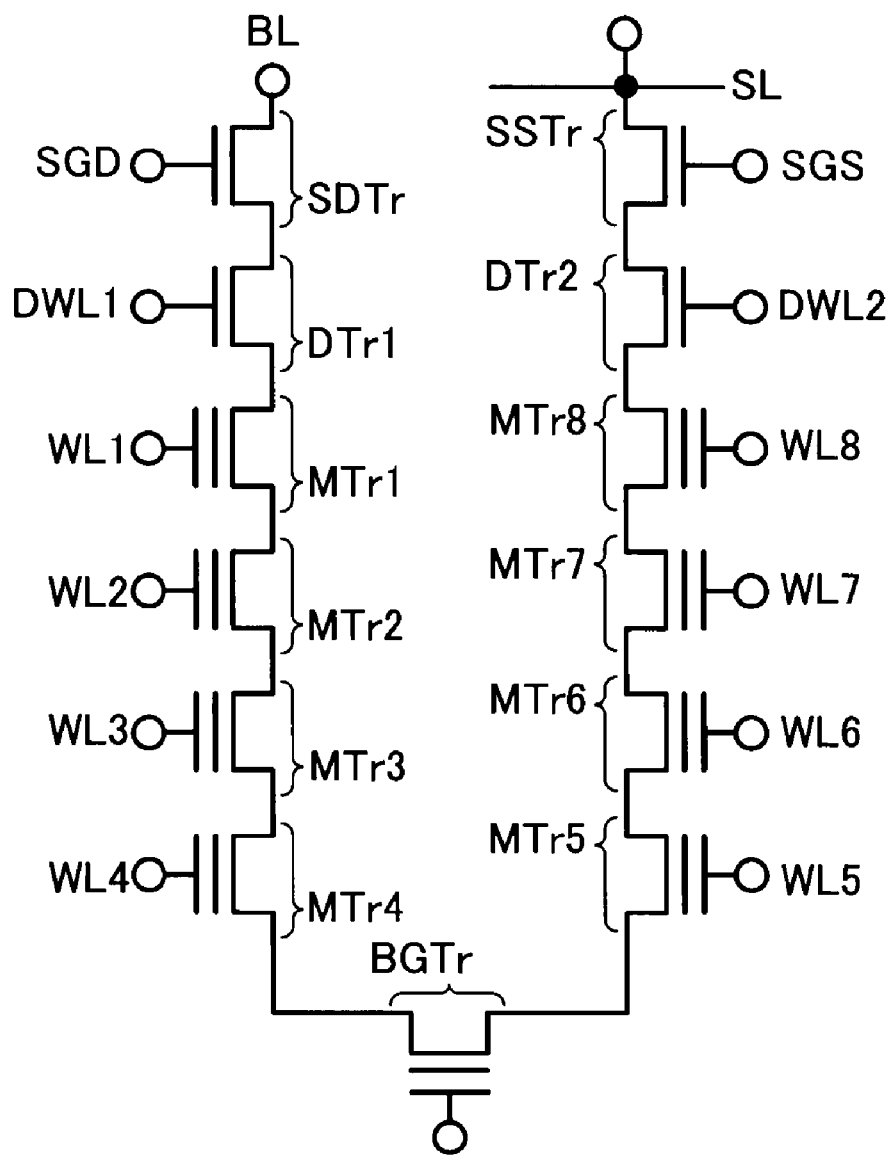
FIG. 26 is a circuit diagram of part of a nonvolatile semiconductor memory device in accordance with the fourth embodiment.

Next, a configuration of a circuit constituted by the memory string MS, the drain side select transistor SDTr, and the source side select transistor SSTr in the fourth embodiment is described with reference to FIGS. 25 and 26. FIG. 26 is a circuit diagram of one memory string MS, the drain side select transistor SDTr, the source side select transistor SSTr, and the dummy transistors DTr in the fourth embodiment.

As shown in FIGS. 25 and 26, in the fourth embodiment, the dummy transistor DTr1 is formed between the memory transistor MTr1 and the drain side select transistor SDTr. The dummy transistor DTr2 is formed between the memory transistor MTr8 and the source side select transistor SSTr.

The dummy transistors DTr1 and DTr2 are configured by the columnar portion CL, the memory gate insulating layer, and the dummy word lines DWL1 and DWL2. Edge portions of the dummy transistors DTr1 and DTr2 in contact with the memory gate insulating layer function as control gate electrodes of the dummy transistors DTr1 and DTr2.

(Specific Configuration of the Nonvolatile Semiconductor Memory Device in Accordance with the Fourth Embodiment)

Figure 27:
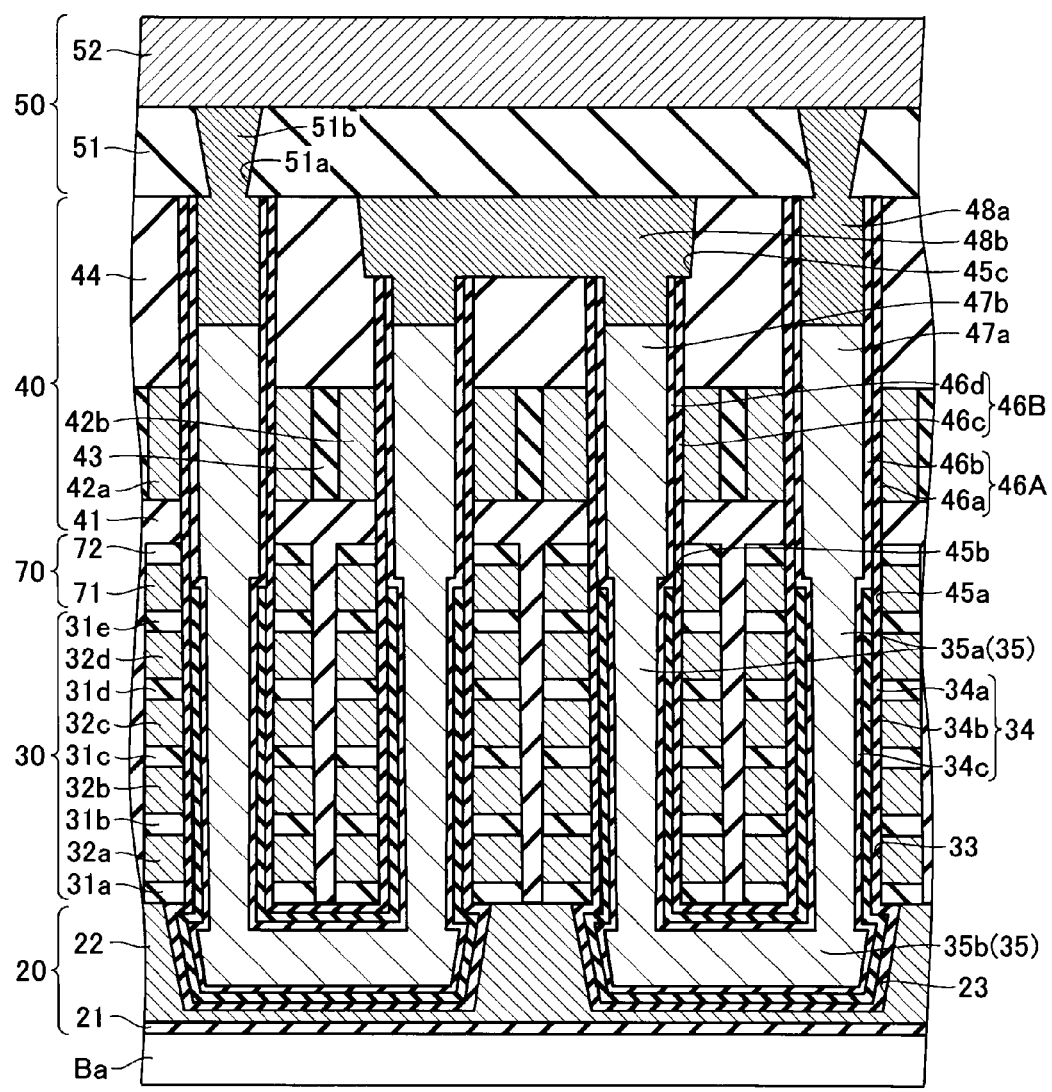
FIG. 27 is a cross-sectional view of the nonvolatile semiconductor memory device in accordance with the fourth embodiment.

Next, a specific configuration of the nonvolatile semiconductor memory device in accordance with the fourth embodiment is described with reference to FIG. 27. FIG. 27 is a cross-sectional view of a memory transistor region of the nonvolatile semiconductor memory device in accordance with the fourth embodiment.

As shown in FIG. 27, the nonvolatile semiconductor memory device in accordance with the fourth embodiment includes a dummy transistor layer 70 in addition to the configurations of the first and second embodiments. The dummy transistor layer 70 is formed between the memory transistor layer 30 and the select transistor layer 40. The dummy transistor layer 70 functions as the dummy transistors DTr1 and DTr2.

The dummy transistor layer 70 includes a dummy word line conductive layer 71 and an inter-dummy word line insulating layer 72 stacked sequentially on the fifth inter-word line insulating layer 31e. The dummy word line conductive layer 71 and the inter-dummy word line insulating layer 72 are formed in lines extending in the row direction with a certain pitch in the column direction. The dummy word line conductive layer 71 and the inter-dummy word line insulating layer 72 are formed so as to surround the U-shaped semiconductor layer 35 (columnar portion 35a), the block insulating layer 34a, and the tunnel insulating layer 34c. The dummy word line conductive layer 71 is constituted by polysilicon (p-Si). The inter-dummy word line insulating layer 72 is constituted by silicon oxide ($SiO_2$).

At a position of a vicinity of a top of the dummy word line conductive layer 71, the block insulating layer 34a, and the tunnel insulating layer 34c are only provided. On the other hand, at a position of a vicinity of a bottom of the dummy word line conductive layer 71, the block insulating layer 34a, the charge storage layer 34b, and the tunnel insulating layer 34c are provided. That is, a thickness of the memory gate insulating layer 34 at the position of the vicinity of the top of the dummy word line conductive layer 71 is smaller than a thickness of the memory gate insulating layer 34 at the position of the vicinity of the bottom of the dummy word line conductive layer 71.

(Advantages of the Nonvolatile Semiconductor Memory Device in Accordance with the Fourth Embodiment)

Next, advantages of the nonvolatile semiconductor memory device in accordance with the fourth embodiment are described. The nonvolatile semiconductor memory device in accordance with the fourth embodiment displays similar advantages to those of the first embodiment.

To describe the advantages in accordance with the fourth embodiment, problems of the first embodiment are herein described. The nonvolatile semiconductor memory device in accordance with the first embodiment has a certain separation provided between the fourth word line conductive layer 32d and the drain side conductive layer 42a (source side conductive layer 42b). This certain separation is provided to prevent the silicon nitride layer 64 from being removed as far as a side surface of the fourth word line conductive layer 32d in the process shown in FIG. 18. However, provision of such a certain separation causes a parasitic resistance between the drain side select transistor SDTr (source side select transistor SSTr) and the memory transistor MTr1 (memory transistor MTr8) to increase.

Accordingly, the nonvolatile semiconductor memory device in accordance with the fourth embodiment includes the dummy transistors DTr1 and DTr2. As a result, the nonvolatile semiconductor memory device in accordance with the fourth embodiment makes it possible to reduce the parasitic resistance between the drain side select transistor SDTr (source side select transistor SSTr) and the memory transistor MTr1 (memory transistor MTr8) by setting the dummy transistors DTr1 and DTr2 to an on state, while maintaining the above-described certain separation. That is, the nonvolatile semiconductor memory device in accordance with the fourth embodiment makes it possible to prevent the silicon nitride layer 64 from being removed as far as the side surface of the fourth word line conductive layer 32d, and at the same time curb incorrect operation due to the parasitic resistance.

Other Embodiments

This concludes description of embodiments of the nonvolatile semiconductor memory device in accordance with the present invention, but it should be noted that the present invention is not limited to the above-described embodiments, and that various alterations, additions, substitutions, and so on, are possible within a range not departing from the scope and spirit of the invention.

For example, in the above-described first embodiment, the U-shaped semiconductor layer 35 may be configured by an n type semiconductor layer. Moreover, the drain side columnar semiconductor layer 47a and the source side columnar semiconductor layer 47b may be configured by a p type semiconductor layer.

When forming the above-described configuration, phosphorus (P) ions for example are injected into the polysilicon layer 66 in-situ in the process shown in FIG. 20 of the first embodiment. Through this process, the U-shaped semiconductor layer 35 is configured by an n type semiconductor layer. Moreover, boron (B) having an acceleration energy of about 80 keV is injected into the drain side columnar semiconductor layer 47a and the source side columnar semiconductor layer 47b in the process shown in FIG. 21 of the first embodiment. Through this process, the drain side columnar semiconductor layer 47a and the source side columnar semiconductor layer 47b are configured by a p type semiconductor layer.

When the U-shaped semiconductor layer 35 is configured by the n type semiconductor layer, and the drain side columnar semiconductor layer 47a and source side columnar semiconductor layer 47b are configured by the p type semiconductor layer as described above, the advantages shown below can be obtained. That is, the nonvolatile semiconductor memory device in accordance with the present invention enables the cell current to be further increased and a read operation to be speeded up. In addition, the nonvolatile semiconductor memory device in accordance with the present invention enables configuration of a select transistor having a high threshold value and excellent cut-off characteristics.

For example, in the above-described manufacturing process shown in FIG. 16 of the nonvolatile semiconductor memory device 100 in accordance with the first embodiment, the sacrifice layer 65 is described as being formed by polysilicon (p-Si). However, the sacrifice layer 65 may be formed by resist. In this case, chemical dry etching (CDE) is performed in an atmosphere including $O_2$ and $CF_4$. Through this process, the sacrifice layer 65 (resist) is removed, and the silicon nitride layer 64 is also selectively removed. That is, there is a change from a state shown in FIG. 16 to a state shown in FIG. 18. The sacrifice layer 65 (resist) is then removed in an atmosphere not including $CF_4$, thereby achieving a state shown in FIG. 19.

If the above-described processes are performed, the process shown in FIG. 17 can be omitted, whereby the nonvolatile semiconductor memory device in accordance with the present invention can be manufactured at a lower cost.

For example, in the above-described second embodiment, the U-shaped semiconductor layer 35A may be configured by an n type semiconductor layer. An impurity concentration of the U-shaped semiconductor layer 35A is $5 \times 10^{18}$ cm$^{-3}$, for example. Moreover, the drain side columnar semiconductor layer 47c and the source side columnar semiconductor layer 47d may be configured by a p type semiconductor layer.

When forming the above-described configuration, phosphorus (P) ions for example are injected into the polysilicon layer 66a in-situ in the process shown in FIG. 23 of the second embodiment. Through this process, the U-shaped semiconductor layer 35A is configured by an n type semiconductor layer. Moreover, subsequent to the processes shown in FIG. 23 of the second embodiment, boron (B) having an acceleration energy of about 5 keV is injected at an inclination of 1°-7° into the polysilicon layer 66a. Through this process, the drain side columnar semiconductor layer 47c and the source side columnar semiconductor layer 47d are configured by a p type semiconductor layer.

When the U-shaped semiconductor layer 35A, and the drain side columnar semiconductor layer 47c and source side columnar semiconductor layer 47d are configured as described above, the nonvolatile semiconductor memory device in accordance with the present invention can display the aforementioned advantages. Furthermore, since the U-shaped semiconductor layer 35A includes the hollow 35c, acceleration energy of injection ions can be curbed. That is, the nonvolatile semiconductor memory device in accordance with the present invention can be manufactured at low cost.

What is claimed is:

1. A nonvolatile semiconductor memory device, comprising:
   a plurality of memory strings each having a plurality of electrically rewritable memory cells connected in series; and
   select transistors each connected to one of the ends of the memory strings,
   each of the memory strings comprising:
   a first semiconductor layer having a pair of columnar portions extending in a perpendicular direction with respect to a substrate, and a joining portion joining lower ends of the pair of columnar portions;
   a first insulating layer surrounding a side surface of the columnar portions;
   a charge storage layer surrounding a side surface of the first insulating layer;
   a second insulating layer surrounding a side surface of the charge storage layer; and
   a first conductive layer surrounding a side surface of the second insulating layer and functioning as a control electrode of the memory cells, and
   each of the select transistors comprising:
   a second semiconductor layer extending upwardly from an upper surface of the columnar portions;
   a third insulating layer surrounding a side surface of the second semiconductor layer;
   a fourth insulating layer surrounding a side surface of the third insulating layer; and
   a second conductive layer surrounding a side surface of the fourth insulating layer and functioning as a control electrode of the select transistors,
   the first semiconductor layer being formed continuously in an integrated manner with the second semiconductor layer, and
   the first insulating layer being formed continuously in an integrated manner with the third insulating layer.

2. The nonvolatile semiconductor memory device according to claim 1,
   wherein the second insulating layer is formed continuously in an integrated manner with the fourth insulating layer.

3. The nonvolatile semiconductor memory device according to claim 1, further comprising dummy transistors provided between the memory strings and the select transistors,
   each of the dummy transistors comprising:
   the first semiconductor layer;
   an insulating layer surrounding the side surface of the columnar portions in the first semiconductor layer; and
   a third conductive layer formed between the first conductive layer and the second conductive layer so as to surround a side surface of the insulating layer and functioning as a control electrode of the dummy transistors.

4. The nonvolatile semiconductor memory device according to claim 1,
   wherein the first semiconductor layer and the second semiconductor layer include a hollow therein.

5. The nonvolatile semiconductor memory device according to claim 1,
   wherein the first semiconductor layer is configured to be of a first conductive type, and the second semiconductor layer is configured to be of a second conductive type.

6. The nonvolatile semiconductor memory device according to claim 3,
   wherein a thickness of the insulating layer at a position of a vicinity of a top of the third conductive layer is smaller than a thickness of the insulating layer at a position of a vicinity of a bottom of the third conductive layer.

7. The nonvolatile semiconductor memory device according to claim 4,
   wherein the memory strings and the select transistors include an internal insulating layer formed so as to fill the hollow.

8. The nonvolatile semiconductor memory device according to claim 7,
   wherein the internal insulating layer is constituted by silicon oxide.

9. A nonvolatile semiconductor memory device, comprising:
   a plurality of memory strings each having a plurality of electrically rewritable memory cells connected in series;
   select transistors each connected to one of the ends of the memory strings; and
   dummy transistors provided between the memory strings and the select transistors,
   each of the memory strings comprising:
   a first semiconductor layer having a pair of columnar portions extending in a perpendicular direction with respect to a substrate, and a joining portion joining lower ends of the pair of columnar portions;
   a first insulating layer surrounding a side surface of the columnar portions;
   a charge storage layer surrounding a side surface of the first insulating layer;
   a second insulating layer surrounding a side surface of the charge storage layer; and
   a first conductive layer surrounding a side surface of the second insulating layer and functioning as a control electrode of the memory cells,
   each of the select transistors comprising:
   a second semiconductor layer extending upwardly from an upper surface of the columnar portions;
   a third insulating layer surrounding a side surface of the second semiconductor layer;
   a fourth insulating layer surrounding a side surface of the third insulating layer; and
   a second conductive layer surrounding a side surface of the fourth insulating layer and functioning as a control electrode of the select transistors, and
   each of the dummy transistors comprising:
   the first semiconductor layer;
   an insulating layer surrounding the side surface of the columnar portions in the first semiconductor layer; and
   a third conductive layer formed between the first conductive layer and the second conductive layer so as to surround a side surface of the insulating layer and functioning as a control electrode of the dummy transistors.

10. The nonvolatile semiconductor memory device according to claim 9, wherein the first semiconductor layer and the second semiconductor layer include a hollow therein.

11. The nonvolatile semiconductor memory device according to claim 9,
wherein the first semiconductor layer is configured to be of a first conductive type, and the second semiconductor layer is configured to be of a second conductive type.

12. The nonvolatile semiconductor memory device according to claim 9,
wherein a thickness of the insulating layer at a position of a vicinity of a top of the third conductive layer is smaller than a thickness of the insulating layer at a position of a vicinity of a bottom of the third conductive layer.

13. The nonvolatile semiconductor memory device according to claim 10,
wherein the memory strings and the select transistors include an internal insulating layer formed so as to fill the hollow.

14. The nonvolatile semiconductor memory device according to claim 13,
wherein the internal insulating layer is constituted by silicon oxide.

15. A method of manufacturing a nonvolatile semiconductor memory device, the nonvolatile semiconductor memory device including a plurality of memory strings each having a plurality of electrically rewritable memory cells connected in series, and select transistors each connected to one of the ends of the memory strings, comprising:
depositing a plurality of first conductive layers sandwiched by first interlayer insulating layers;
depositing on an upper layer of the first conductive layers a second conductive layer sandwiched by second interlayer insulating layers;
penetrating the plurality of first conductive layers in a U-shape as viewed from a direction parallel to a substrate to form a first hole;
penetrating the second conductive layer to form a second hole;
forming a first insulating layer on a side surface of the first conductive layers facing the first hole and on a side surface of the second conductive layer facing the second hole;
forming a charge storage layer on a side surface of the first insulating layer facing the first hole and the second hole;
selectively removing the charge storage layer facing the second hole;
forming a second insulating layer continuously in an integrated manner on a side surface of the charge storage layer facing the first hole and on a side surface of the first insulating layer facing the second hole; and
forming a semiconductor layer continuously in an integrated manner so as to fill the first hole and the second hole.

16. The method of manufacturing a nonvolatile semiconductor memory device according to claim 15, further comprising:
forming a sacrifice layer so as to fill the first hole and the second hole, subsequent to forming the charge storage layer on the side surface of the first insulating layer;
selectively removing the sacrifice layer in the second hole;
selectively removing the charge storage layer facing the second hole, using the sacrifice layer as a mask; and
removing the sacrifice layer in the first hole.

17. The method of manufacturing a nonvolatile semiconductor memory device according to claim 15, further comprising forming a hollow in the semiconductor layer.

18. The method of manufacturing a nonvolatile semiconductor memory device according to claim 15,
wherein a lower portion of the semiconductor layer is configured to be of a first conductive type, and an upper portion of the semiconductor layer is configured to be of a second conductive type.

19. The method of manufacturing a nonvolatile semiconductor memory device according to claim 17, further comprising forming an internal insulating layer so as to fill the hollow.

20. The method of manufacturing a nonvolatile semiconductor memory device according to claim 19,
wherein the internal insulating layer is constituted by silicon oxide.

* * * * *